(12) United States Patent
Matsumoto et al.

(10) Patent No.: US 8,132,080 B2
(45) Date of Patent: Mar. 6, 2012

(54) COMMUNICATION APPARATUS AND DECODING METHOD

(75) Inventors: Wataru Matsumoto, Tokyo (JP); Rui Sakai, Tokyo (JP); Hideo Yoshida, Tokyo (JP); Yoshikuni Miyata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 999 days.

(21) Appl. No.: 11/988,565

(22) PCT Filed: Jul. 12, 2006

(86) PCT No.: PCT/JP2006/313891
§ 371 (c)(1),
(2), (4) Date: Apr. 11, 2008

(87) PCT Pub. No.: WO2007/007801
PCT Pub. Date: Jan. 18, 2007

(65) Prior Publication Data
US 2009/0132887 A1    May 21, 2009

(30) Foreign Application Priority Data
Jul. 13, 2005  (JP) ................................ 2005-205004
Feb. 23, 2006  (JP) ................................ 2006-047392

(51) Int. Cl.
*H03M 13/45* (2006.01)
(52) U.S. Cl. ...................................................... 714/780
(58) Field of Classification Search .................. 714/752, 714/780
See application file for complete search history.

(56) References Cited

U.S. PATENT DOCUMENTS

| 7,137,060 B2 * | 11/2006 | Yu et al. ........................ 714/794 |
| 7,178,081 B2 * | 2/2007 | Lee et al. ....................... 714/752 |
| 7,184,486 B1 * | 2/2007 | Wu et al. ........................ 375/262 |
| 7,219,288 B2 * | 5/2007 | Dielissen et al. ............. 714/752 |
| 7,299,397 B2 * | 11/2007 | Yokokawa et al. ........... 714/752 |
| 2004/0123230 A1 | 6/2004 | Lee et al. |
| 2004/0153938 A1 | 8/2004 | Okamura et al. |

FOREIGN PATENT DOCUMENTS

JP    2004-186940 A    7/2004
(Continued)

OTHER PUBLICATIONS

Sakai et al., "δ-Min-Fukugo Algorithm no Kento," Dai 27 Kai Joho Riron to Sono Oyo Symposium Yokoshu (vol. I of II). 2004, pp. 175-178.

(Continued)

*Primary Examiner* — Stephen Baker
(74) *Attorney, Agent, or Firm* — Birch, Stewart, Kolasch & Birch, LLP

(57) ABSTRACT

A communication apparatus includes a storage unit, a row processing unit, and a column processing unit. The row processing unit repeatedly performs row processing to calculate a column-processing LLR for each column and each row in a check matrix. The column processing unit calculates a row-processing LLR for each column and each row of the check matrix, and repeatedly performs column processing to store in the storage unit the minimum value k of absolute values of the row-processing LLR. The row processing unit and the column processing unit alternately performs their processing. The row processing unit performs calculation using an approximate minimum value while the column processing unit cyclically updates the minimum k value of each row.

36 Claims, 14 Drawing Sheets

FOREIGN PATENT DOCUMENTS

KR  10-2004-0056972 A  7/2004
WO  WO-2006/059688 A1  6/2006

OTHER PUBLICATIONS

Sakai et al., "δ-Min Fukugo Algorithm no Kento," Dai 27 Kai Joho Riron to Sono Oyo Symposium Yokoshu (vol. I of II), 2004, pp. 175-178.

Wadayama, "Low-Density Parity-Check codes and its Decoding Algorithm, LDPC (Low Density Parity Check) code/sum-product decoding algorithm" Triceps, Jun. 5, 2002, p. 92-97.

Banihashemi A. H., et al., "On Implementation of Min-Sum Algorithm and Its Modifications for Decoding Low-Density Parity-Check (LDPC) Codes", IEEE Transactions on Communications, vol. 53, No. 4, Apr. 2005, pp. 549-554. XP-011131324.

Fossorier M.P.C., et al., "Reduced Compexity Iterative Decoding of Low-Density Parity Check Codes Based on Belief Propagation", IEEE Transactions on Communications, vol. 47, No. 5, May 1999, pp. 673-680. XP-002313256.

Chen J., et al. "Density Evolution for Two Improved BP-Based Decoding Algorithms of LDPC Codes", IEEE Communications Letter, vol. 6, No. 5, May 2002, pp. 208-210. XP-002320747.

* cited by examiner

COMMUNICATION APPARATUS AND DECODING METHOD

TECHNICAL FIELD

The present invention relates to an error correction technology in digital communication, and, particularly to a communication apparatus at a receiving side and a decoding method for decoding an LDPC (Low-Density Parity Check)-encoded signal.

BACKGROUND ART

As basic algorithms of decoding an LDPC code, there are a "Sum-Product algorithm" and a "Min-Sum algorithm". According to these algorithms, the decoding is performed while repeatedly calculating a likelihood ratio (LLR) as probabilistic reliability information of a reception signal (see Nonpatent Document 1). The "Sum-Product algorithm" has high decoding performance, but has high calculation cost for packaging such as the need for holding a table, because a calculation using a mathematical function is required. At least a memory that stores intermediate values by only the number of "1" contained in a binary check matrix of "0" and "1" is necessary. On the other hand, the "Min-Sum algorithm" does not require a mathematical function, and has small calculation cost, but decoding performance is degraded.

The "Sum-Product algorithm" is explained. First, at the transmitter side, transmission data is LDPC encoded using a parity check matrix H of M rows×N columns, and a codeword $c = (c_1, c_2, \ldots, c_N)$, $c_n = 0, 1$ ($n=1, 2, \ldots, N$). A modulation such as a BPSK (Binary Phase Shift Keying) modulation is performed to this codeword c, and a modulation signal $x = (x_1, x_2, \ldots, x_N)$ is sent.

On the other hand, the receiver side receives, via an Additive White Gaussian Noise Channel (AWGN channel), a signal $y = (y_1, y_2, \ldots, y_N)$ as expressed by the following Equation (1):

$$y_n = x_n + e_n \quad (1)$$

where $e_n$ is a Gaussian noise series of which average is 0, and a variance $\sigma^2 = N_0/2$.

At the receiver side, a predetermined digital demodulation corresponding to the above BPSK modulation is performed to the modulation signal received via the above channel. Further, iterative decoding by the "Sum-Product algorithm" is executed to a logarithmic likelihood ratio (LLR) obtained from the demodulation result, and a hard decision result is finally output.

A conventional decoding method "Sum-Product algorithm" implemented by the above receiver is shown below.

(Initialization Step)

First, the number of repetitions l=1 and the maximum number of repetitions $l_{max}$ are set, and, as LLR: $\beta_{mn}^{(l=1)}$ from a bit node to a check node at the initial time, a reception LLR: $\lambda_n$ is input as given by the following Equation (2):

$$\beta_{mn}^{(l)} = \lambda_n$$

n=1, 2, ..., N m=1, 2, ..., M  (2)

(Row Processing Step)

Next, as row processing, LLR: $\alpha_{mn}^{(l)}$ at the first repetition (repetition first-time LLR: $\alpha_{mn}^{(l)}$) of a bit n to be sent from the check node m to the bit node n is updated for each m and n by the following Equation (3):

[Expression 1]

$$\alpha_{mn}^{(1)} = 2\tanh^{-1}\left(\prod_{n' \in N(m)\backslash n} \tanh\left(\frac{\beta_{mn'}^{(l-1)}}{2}\right)\right) \quad (3)$$

where N(m) is a set of column numbers having "1" of a m-th row, n' is N(m) other than n, and $\beta_{mn'}^{(l-1)}$ is LLR from the (l-1)-th bit node to the check node other than an n-th column.

(Column Processing Step)

Next, as a column processing, a repetition first-time LLR: $\beta_{mn}^{(l)}$ of a bit n to be sent from the bit node n to the check node m is updated for each m and n by the following Equation (4):

[Expression 2]

$$\beta_{mn}^{(1)} = \lambda_n + \sum_{m' \in M(n)\backslash m} \alpha_{m'n}^{(1)} \quad (4)$$

A repetition first-time posterior value $\beta_n^{(l)}$ of a bit n for a hard decision is updated for each n by the following Equation (5):

[Expression 3]

$$\beta_n^{(1)} = \lambda_n + \sum_{m' \in M(n)} \alpha_n^{(1)} \quad (5)$$

where M(n) is a set of row numbers having "1" of an n-th column, m' is M(n) other than m, and $\beta_{m'n}^{(l)}$ is LLR from the first check node to the bit node other than an m-th row.

(Stop Regulation)

Thereafter, when the repetition first-time posterior value $\beta_n^{(l)}$ of the bit n is "$\beta_n^{(l)} > 0$", a decoding result is "$x_n' = 1$" (where x' corresponds to the original transmission signal x). On the other hand, when "$\beta_n^{(l)} \leq 0$", a decoding result is "$x_n' = 0$", and a decoding result $x' = (x_1', x_2', \ldots, x_N')$ is obtained.

When a result of parity check is "Hx'=0" or when the number of repetitions is "$l = l_{max}$" (when any one of these condition is satisfied), a decoding result x' in this case is output. When none of the two conditions is satisfied, "l=l+1" is set, and the process control returns to the above row processing. Thereafter, the calculation is sequentially performed.

Nonpatent Document 1: Low-Density Parity-Check Codes and Its Decoding Algorithm, LDPC (Low Density Parity Check) code/sum-product decoding algorithm, Tadashi Wadayama, Triceps.

DISCLOSURE OF INVENTION

Problem to be Solved by the Invention

However, while the above "Sum-Product algorithm" is known to have high decoding performance, this algorithm requires a repeated calculation (calculation of $\tanh^{-1}$), using a mathematical function. Therefore, this algorithm has a problem in that calculation load at the receiver side becomes high whether hardware or software is used to realize this algorithm. There is also a method of holding a predetermined table to decrease the calculation load (table lookup). However, this method increases the memory capacity necessary to store the table.

In the above "Sum-Product algorithm", at least a memory that stores intermediate values (algorithmic likelihood ratios of each row, updated values for each repetition, etc.) by only the number of "1 (weight)" contained in a binary check matrix of "0" and "1" is necessary. That is, a consumption amount of the memory becomes very large. Further, the above "Sum-Product algorithm" has also problems that the number of quantization bits is large, the number of repetitions is large, etc.

The present invention has been achieved to solve the above problems in the conventional technology and it is an object of the present invention to provide a communication apparatus and a decoding method, capable of reducing calculations and a memory capacity required in decoding of an LPDC encoded codeword. The invention also has an object of providing a communication apparatus and a decoding method, capable of achieving a reduction in the quantization size and a reduction in the number of repetitions.

Means for Solving Problems

To solve the problems and achieve the object mentioned above, there is provided a communication apparatus that decodes an LDPC-encoded codeword using a check matrix including: a retaining unit that retains an intermediate value obtained by a predetermined process in a decoding algorithm; a row processing unit that performs row processing of calculating a logarithmic likelihood ratio (logarithmic likelihood ratio to be sent from a check node to a bit node: column-processing LLR) used in the column processing based on an absolute value of a logarithmic likelihood ratio (logarithmic likelihood ratio to be sent from a bit node to a check node: row-processing LLR) corresponding to a row weight of a check matrix; and a column processing unit that calculates a row-processing LLR to be used in the row processing based on a column-processing LLR corresponding to a column weight, and stores a minimum value of absolute values of the row-processing LLR in the retaining unit. The column processing unit performs decoding while updating the minimum k value of the row.

EFFECT OF THE INVENTION

According to the present invention, in the LDPC decoding, an absolute value of an LLR for row processing is reduced to a minimum k value in a row unit by a cyclic structure. Therefore, there is an effect that the memory capacity required to store the absolute values can be substantially reduced. Further, according to the present invention, probability propagation can be performed more efficiently than that performed by the conventional "Min-Sum algorithm". Therefore, the number of repetitions of decoding can be substantially reduced. As a result, the calculations in decoding can be substantially reduced.

BRIEF DESCRIPTION OF DRAWINGS

FIG. 5-1 is a configuration example of an LDPC decoder according to a first embodiment.

FIG. 5-2 is a configuration example of the LDPC decoder according to the first embodiment.

FIG. 7-1 is a configuration example of a column processing unit that performs column processing according to the "Cyclic approximated min algorithm".

FIG. 7-2 is a configuration example of the column processing unit that performs column processing according to the "Cyclic approximated min algorithm".

EXPLANATIONS OF LETTERS OR NUMERALS

Figure 1:
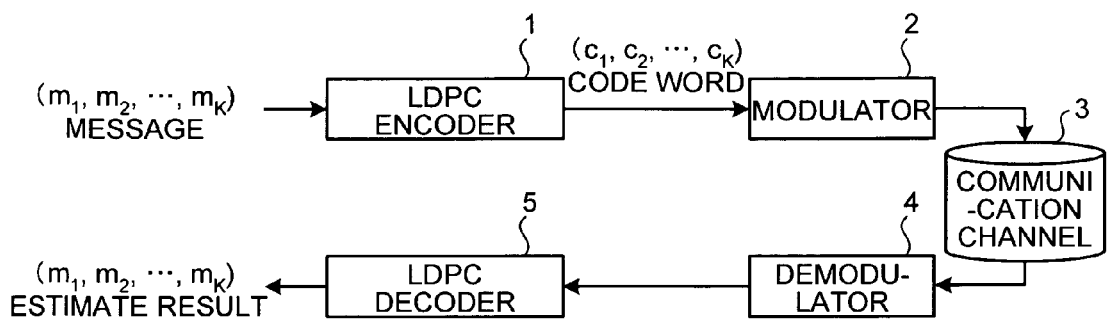
FIG. 1 is a configuration example of a communication system including an LDPC encoder and an LDPC decoder.

1 LDPC encoder
2 Modulator
3 Communication channel
4 Demodulator
5 LDPC decoder
11 Reception-LLR calculating unit
12 Decoding core unit
21, 21a Decoding core unit
22, 22-1, 22-2, 22-G Row processing unit
23, 23-1, 23-2, 23-G Column processing unit
24 Decoding-result determining unit
25, 25a Controller
31, 31a, 31b, 31c Minimum-value selecting unit
32 Sign calculating unit
33 LLR calculating unit
41 α adding unit
42 λ adding unit
43 Minimum-k-value comparing unit
44 Sign calculating unit
45 Switch

BEST MODE(S) FOR CARRYING OUT THE INVENTION

Exemplary embodiments of a communication apparatus and a decoding method according to the present invention are explained in detail below with reference to the accompanying drawings. Note that the present invention is not limited to the embodiments. The present invention can be applied to decoding at a terminal and a base station, in wireless communication through, for example, a portable telephone. The present invention can also be applied to decoding in satellite communication, an HDD, optical communication, a wireless LAN, a quantum code, and the like.

First Embodiment

Described first is positioning, in a communication system, of a communication apparatus and an LDPC decoder that implements a decoding method according to the present invention. FIG. 1 is a configuration example of the communication system including an LDPC encoder and an LDPC decoder. In FIG. 1, a communication apparatus at the transmission side (hereinafter, "transmitting device") includes an LDPC encoder 1 and a modulator 2, and a communication apparatus at the receiving side (hereinafter, "receiving device") includes a demodulator 4 and an LDPC decoder 5.

A flow of encoding and decoding in the communication system that employs an LDPC code is briefly explained. The LDPC encoder 1 within the transmitting device generates a generation matrix G of K rows×N columns according to a known method (K: an information length, N: a codeword length). The LDPC encoder 1 receives a message $(m_1, m_2, \ldots, m_K)$ of the information length K, and generates a codeword C, using this message and the above generated matrix G, as represented by the following Equation (6):

$$C = (m_1, m_2, \ldots, m_K)G \quad (6)$$
$$= (c_1, c_2, \ldots, c_N)$$

When a parity check matrix for the LDPC is H (M rows×N columns), the generation matrix G satisfies $GH^T=0$ (T is a transposed matrix), $H(c_1, c_2, \ldots, c_N)^T=0$.

The modulator 2 performs a digital modulation to the codeword C generated by the LDPC encoder 1, by a predetermined modulation system such as BPSK, multivalue PSK, multivalue QAM, etc., and transmits a modulation signal $x=(x_1, x_2, \ldots, x_N)$ to the receiving device via a communication channel 3.

On the other hand, in the receiving device, the demodulator 4 performs a digital demodulation corresponding to the above modulation system such as BPSK, multivalue PSK, multivalue QAM, etc. to a modulation signal $y=(y_1, y_2, \ldots, y_N)$ that is received via the communication channel 3. Further, the LDPC decoder 5 performs decoding according to the decoding algorithm of the present embodiment, described later, using a logarithmic likelihood ratio (LLR) obtained from the demodulation result, and outputs a hard decision value (corresponding to the original message $m_1, m_2, m_K$) as a decoding result.

Before explaining the decoding algorithm of the present embodiment, the "Min-Sum algorithm" is explained as the conventional decoding algorithm that is the basis of the decoding algorithm.

According to the "Min-Sum algorithm", the initialization step similar to that of the "Sum-Product algorithm" described above is first performed. Next, the row processing step of the "Min-Sum algorithm" is performed. Thereafter, the column processing step and the stop regulation similar to those of the "Sum-Product algorithm" described above are performed to calculate and update probability information.

Figure 2:
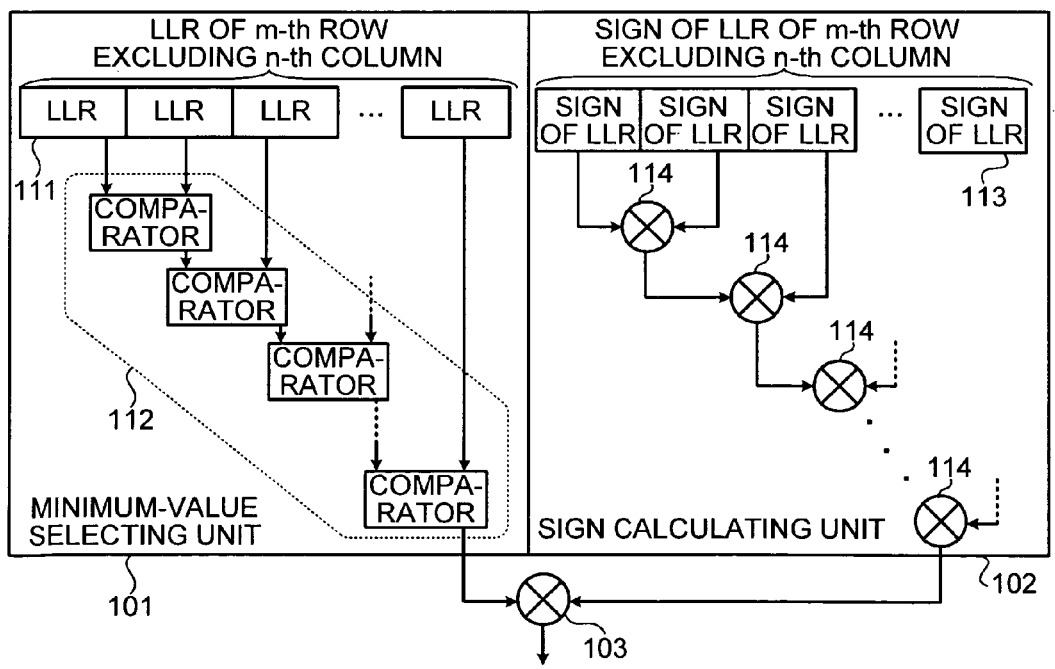
FIG. 2 is a configuration example of a row processing unit that executes a row processing step of the "Min-Sum algorithm" in the LDPC decoder.

FIG. 2 is a configuration example of a row processing unit that performs a row processing step of the "Min-Sum algorithm" in an LDPC decoder. This row processing unit includes: a minimum-value selecting unit 101 including a memory unit 111 that stores therein the LLR: $\beta_{mn'}^{(l-1)}$ of a row weight portion of the parity check matrix H, and a comparator 112 that compares sizes of the LLR and outputs a minimum value of the LLR; a sign calculating unit 102 including a memory unit 113 that stores therein a sign of an LLR of the row weight portion, and a multiplying unit 114 that multiplies signs of the LLR (+ or −); and an LLR calculating unit 103 that calculates an LLR: $\alpha_{mn}^{(l)}$ by multiplying a minimum value obtained from the minimum-value selecting unit 101 with a multiplication result of signs (+ or −) obtained from the sign calculating unit 102.

In the row processing unit, the comparator 112 of the minimum-value selecting unit 101 includes a plurality of comparators of two inputs (a, b). Each comparator receives LLR for comparison from the above memory unit 111 and a former-stage comparator (the first-stage comparator receives LLR from only the memory unit 111), and when "|a|<|b|", each comparator outputs |a|. In other cases, each comparator outputs |b|, thereby outputting a minimum value of absolute values of the LLR. The LLR calculating unit 103 multiplies the above minimum value with the multiplication result of the above sign, and delivers the LLR: $\alpha_{mn}^{(l)}$ as the multiplication result, to the column processing unit.

Figure 3:
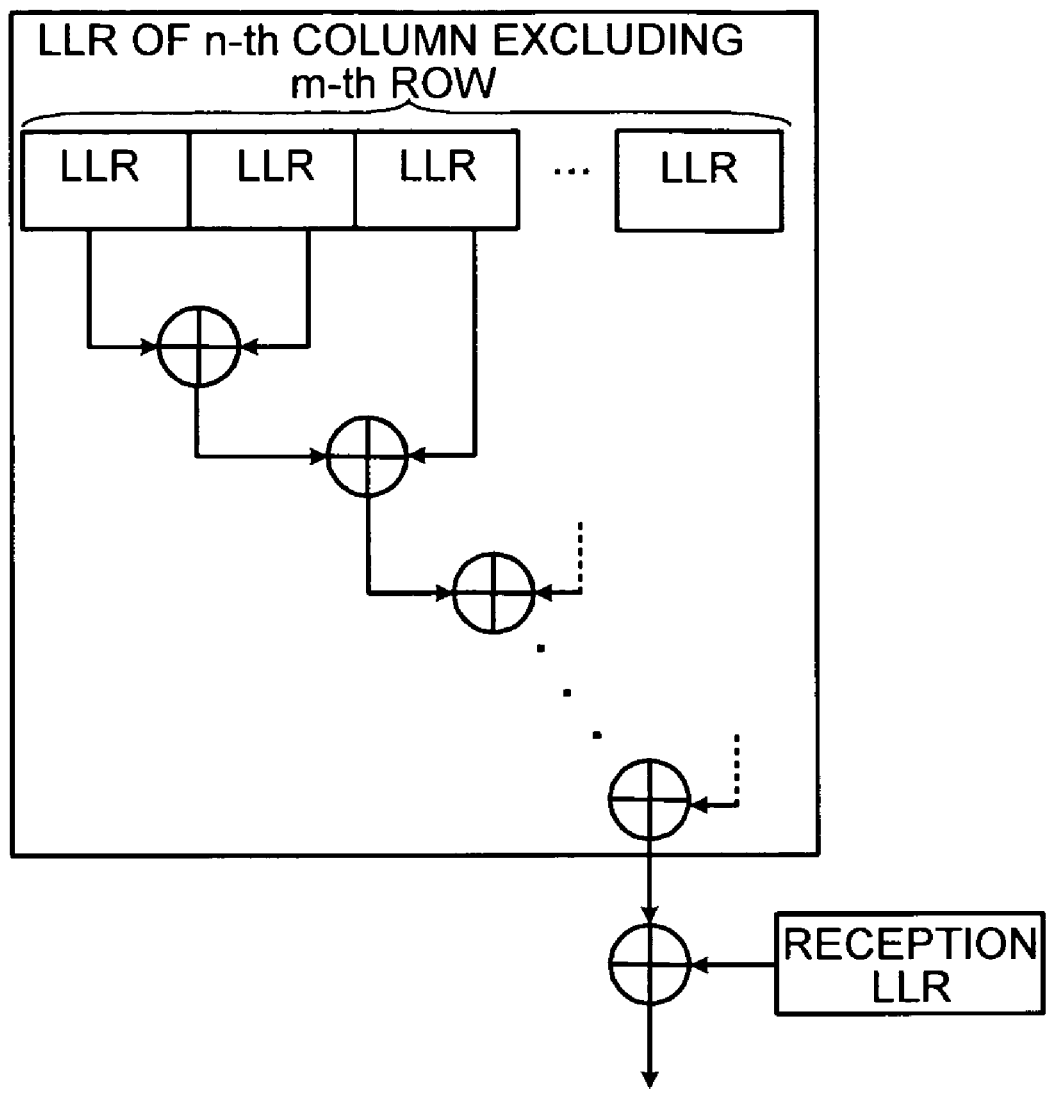
FIG. 3 is a configuration example of a column processing unit that performs a column processing step of the "Min-Sum algorithm" in the LDPC decoder.

FIG. 3 is a configuration example of the column processing unit that performs a column processing step of the "Min-Sum algorithm" in an LDPC decoder. This column processing unit retains the LLR: $\alpha_{m'n}^{(l)}$ of a column weight of the parity check matrix H, and adds each LLR, thereby outputting the repetition first-time posterior value $\beta_n^{(l)}$.

(Row Processing Step)

The row processing of the above "Min-Sum algorithm" can be generalized by the following Equation (7). In this case, as the row processing, the repetition first-time LLR: $\alpha_{mn}^{(l)}$ of the bit n from the check node m to the bit node n is updated for each of m and n by the following Equation (7):

[Expression 4]

$$\begin{aligned}\alpha_{mn}^{(l)} &= 2\tanh^{-1}\left(\prod_{n' \in N(m)\backslash n} \tanh\left(\frac{\beta_{mn'}^{(l-1)}}{2}\right)\right) \\ &= 2\tanh^{-1}\left(\prod_{n' \in N(m)\backslash n} \mathrm{sgn}(\beta_{mn'}^{(l-1)}) \cdot \prod_{n' \in N(m)\backslash n} \tanh\left(\frac{|\beta_{mn'}^{(l-1)}|}{2}\right)\right) \\ &= \prod_{n' \in N(m)\backslash n} \mathrm{sgn}(\beta_{mn'}^{(l-1)}) \cdot 2\tanh^{-1}\left(\prod_{n' \in N(m)\backslash n} \tanh\left(\frac{|\beta_{mn'}^{(l-1)}|}{2}\right)\right) \\ &\approx \prod_{n' \in N(m)\backslash n} \mathrm{sgn}(\beta_{mn'}^{(l-1)}) \cdot \min_{n' \in N(m)\backslash n} |\beta_{mn'}^{(l-1)}|\end{aligned} \quad (7)$$

where min $|\beta_{mn'}^{(l-1)}|$ is the minimum value of absolute values of the LLR: $\beta_{mn'}^{(l-1)}$ excluding the n-th column in the m-th row of the parity check matrix H, and sgn($\beta_{mn'}^{(l-1)}$) is the sign of the LLR: $\beta_{mn'}^{(l-1)}$ excluding the n-th column.

As described above, according to the "Min-Sum algorithm", after a row processing step, processing based on column processing and stop regulation similar to those of the "Sum-Product algorithm" is performed to obtain a final sign result.

Figure 4:
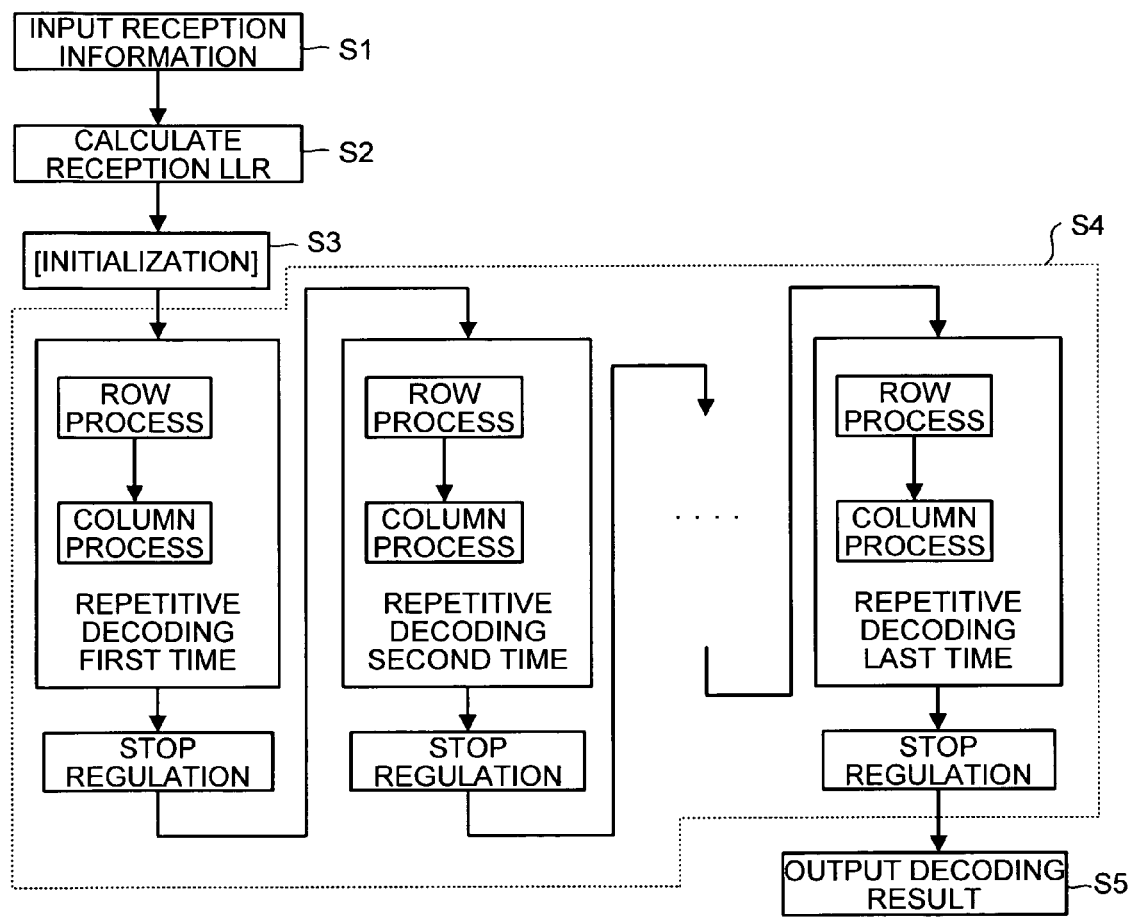
FIG. 4 is a flowchart of a process according to the "Min-Sum algorithm".

Next, the flow of the process according to the "Min-Sum algorithm" is briefly explained referring to FIG. 4.

According to the "Min-Sum algorithm", a reception LLR is calculated from reception information (steps S1, S2), and the calculation result is set in the memory unit 111 as an initial value. Further, the number of repetitions is initialized as l=1 (step S3). Row processing is performed first time in the iterative decoding calculation (repetition first-time decoding calculation) (step S4: the first iterative decoding to the last iterative decoding). Next, column processing in the repetition first-time decoding calculation is performed, and thereafter, a posterior value calculated in the repetition first-time decoding calculation is subjected to a hard decision. This determination value is determined as a decoding result, and a parity check is performed (stop regulation). In the above stop regulation, when the parity check result becomes OK or when the number of repetitions becomes l=l$_{max}$, a decoding result this time is finally output (step S5).

In the above "Min-Sum algorithm", calculations and the required memory capacity are reduced from those of the "Sum-Product algorithm", by approximating the row processing of the "Sum-Product algorithm", i.e., Equation (3). However, in the above "Min-Sum algorithm", a large memory capacity corresponding to the number of "1 (weight)" contained in the parity check matrix H is necessary to store the intermediate value. Further improvement is necessary to reduce the required memory capacity.

The decoding algorithm according to the present embodiment explained below achieves a further reduction in required memory capacity and calculations, and is the improved algorithm of the "Min-Sum algorithm" as the approximated decoding method of the "Sum-Product algorithm", for example.

A configuration of the LDPC decoder 5 constituting the receiving device according to the present invention, and a decoding method (decoding algorithm) performed by the LDPC decoder 5, are explained in detail below with reference to the drawings.

Figures 1, 5:
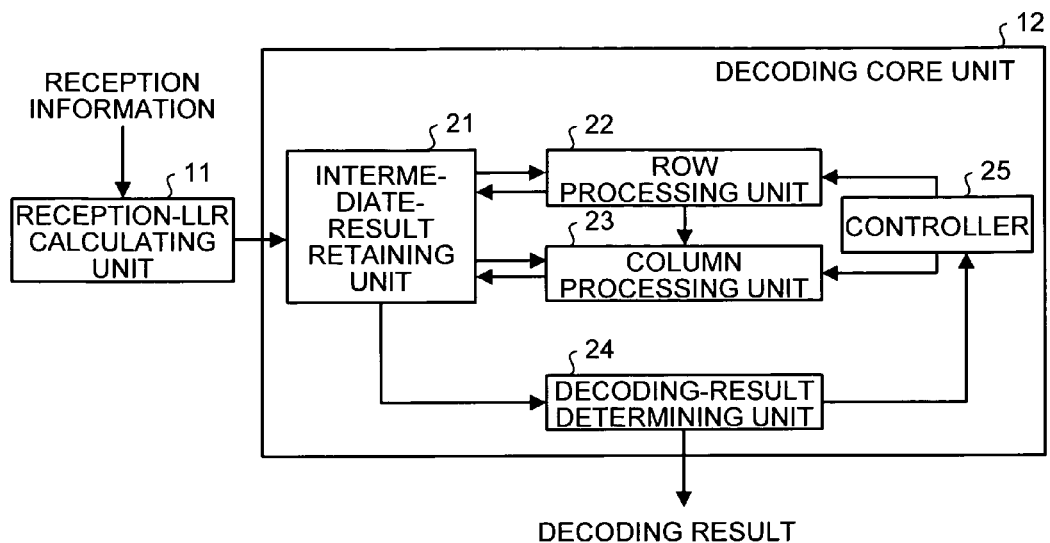
Figures 2, 5:
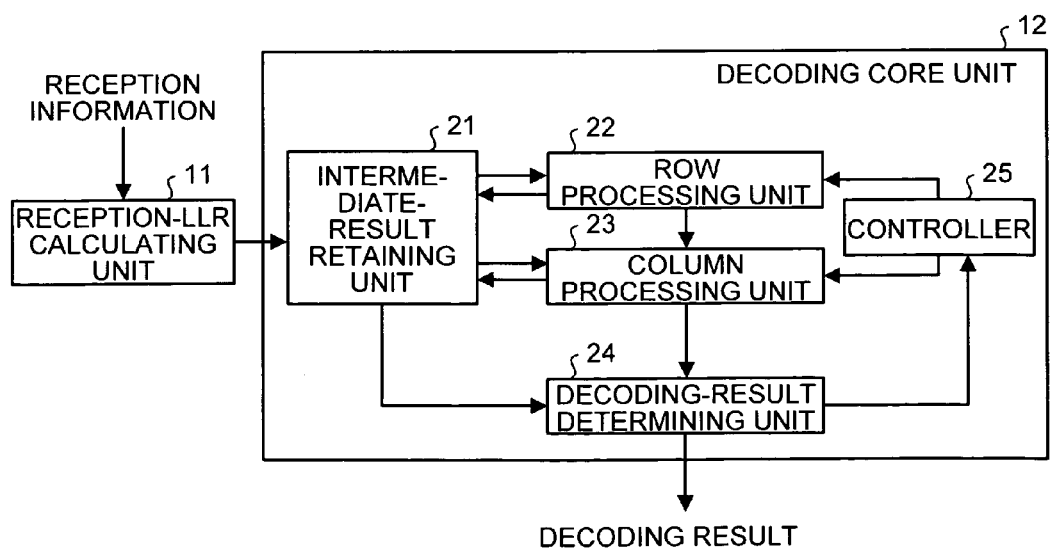

FIG. 5-1 depicts a configuration of the LDPC decoder 5 according to the present embodiment. This LDPC decoder 5 includes a reception-LLR calculating unit 11 that calculates the reception LLR from the reception information, and the decoding core unit 12 that performs decoding according to the present embodiment. The decoding core unit 12 includes an intermediate-result retaining unit 21 configured by a memory which stores therein an intermediate result (intermediate value) of decoding, a row processing unit 22 that performs row processing according to the present embodiment, a column processing unit 23 that performs column processing according to the present embodiment, a decoding-result determining unit 24 that performs a hard decision on a posterior value in the column processing and an error determination of a parity check result, as a stop regulation according to the present embodiment, and a controller 25 that performs a repetition control of decoding.

The decoding algorithm according to the present embodiment is a method of cyclically updating only the absolute value of the LLR of the minimum k value. Because this algorithm is the method of decoding using an approximate minimum value instead of an accurately minimum value, this method is hereinafter called the "Cyclic approximated min algorithm". The minimum k value represents "from the minimum value to the k-th value in the ascending order.

The "Cyclic approximated min algorithm" executed in the receiving device is shown below.

(Initialization Step)

First, the number of repetitions l=1 and the maximum number of repetitions l$_{max}$ are set. The LLR of the minimum k value of the m-th row at the initial time is set as $\beta_{mn(i)}^{(0)}$, and a reception LLR: $\lambda_n$ is input to obtain $B_{mn(i)}$ as in the following Equation (8). As a sign of the LLR: $\beta_{mn}^{(0)}$ of the m-th row at the initial time, sgn($\lambda_n$) is input to obtain $S_m$ as in the following Equation (8):

[Expression 5]

$$B_{mn(i)} = |\beta_{mn(i)}^{(0)}| = \min_{n \in N(m) \setminus \{n(1), n(2), \ldots, n(i-1)\}} [|\lambda_n|], \forall i \in [1, k] \quad (8)$$

$$S_m = \prod_{n \in N(m)} \text{sgn}(\lambda_n)$$

$$n(i) = \arg \min_{n \in N(m) \setminus \{n(1), n(2), \ldots, m(1-1)\}} [|\lambda_n|]$$

$$n(0) = \phi$$

where $B_{mn(i)}$ is an absolute value of the LLR: $\beta_{mn(i)}$ of the minimum k value of the m-th row, n(i) is a column number of the minimum i-th LLR in $B_{mn(i)}$, and $S_m$ is a product of signs (+ or −) of the LLR: $\beta_{mn}$ of the m-th row.

(Row Processing Step)

In the present embodiment, a starting column of the row processing is arbitrary. At the stage where the process ends to the last column, decoding is performed again cyclically from the first column. As the row processing, the repetition first-time LLR: $\alpha_{mn}^{(l)}$ of the bit n to be sent from the check node m to the bit node n is updated for $1 \leq n \leq N$ and for each m by the following Equation (9):

[Expression 6]

$$\alpha_{mn}^{(l)} = \prod_{\substack{n' \in N(m) \setminus n \\ n' < n}} \text{sgn}(\beta_{mn'}^{(l)}) \cdot \prod_{n' \in N(m) \setminus n} \text{sgn}(\beta_{mn'}^{(l-1)}) \cdot \min_{n' \in N_k(m) \setminus n} [B_{mn'}] \quad (9)$$

$$= S_m \cdot \text{sgn}(\beta_{mn}^{(l-1)}) \cdot \min_{n' \in N_k(m) \setminus n} [B_{mn'}]$$

$$= S'_m \cdot \min_{n' \in N_k(m) \setminus n} [B_{mn'}]$$

$$S'_m = S_m \cdot \text{sgn}(\beta_{mn}^{(l-1)})$$

where $N_k(m)$ is the set of n(i) of the m-th row, and is expressed as $N_k(m) = \{n(1), n(2), \ldots, n(k)\}$. Specifically, when the current column number is n, a column number that satisfies "n'<n" takes the product of signs of the LLR: $\beta_{mn'}^{(l)}$ updated in the first-time column processing, and a column number that satisfies "n'>n" takes the product of signs of the LLR: $\beta_{mn'}^{(l-1)}$ updated by the (l−1)-th time column processing. A result of multiplying these results by the minimum LLR: min[$\beta_{mn'}$] in the minimum k value of the m-th row is set as the updated LLR: $\alpha_{mn}^{(l)}$ of the column number n. In the present embodiment, the term of multiplying the product of the signs of $\beta_{mn'}^{(l)}$ by the product of the signs of $\beta_{mn'}^{(l-1)}$ is substituted by the term of multiplying $S_m$ updated at the (l−1)-th time by the sign of $\beta_{mn'}$ updated at the (l−1)-th time. With this arrangement, calculations and the required memory capacity can be reduced.

(Column Processing Step)

Next, as the column processing, the repetition first-time LLR: $\beta_{mn}^{(l)}$ of the bit n to be sent from the bit node n to the check node m is updated for each m and n by the following Equation (10):

[Expression 7]

$$\beta_{mn}^{(1)} = \lambda_n + \sum_{m' \in M(n) \backslash m} \alpha_{m'n}^{(1)} \quad (10)$$

$$S_m = S'_m \cdot \text{sgn}(\beta_{mn}^{(1)})$$

$$n(i) = \arg \min_{n' \in N_k(m) \backslash \{n(1), n(2), \ldots, n(i-1), n(i)\}} [B_{mn'}, |\beta_{mn}^{(1)}|]$$

$$B_{mn(i)} = \min_{n' \in N_k(m) \backslash \{n(1), n(2), \ldots, n(i-1), n(i)\}} [B_{mn'}, |\beta_{mn}^{(1)}|],$$

$$\forall i \in [1, k]$$

Specifically, in the column number n, a result of the addition of the reception LLR: $\lambda_n$, and a total value of the LLR: $\alpha_{m'n}^{(l)}$ other than the m-th row LLR updated in the first-time row processing is expressed as the updated LLR: $\beta_{mn}^{(l)}$. The above $S_m'$ is multiplied by the sign (+ or −) of $\beta_{mn}^{(l)}$ updated in the first-time column processing, thereby updating $S_m$ to be used in the row processing. The two equations in Equation (10) prescribe the sort process (minimum k value) of $B_{mn(l)}$.

To perform a hard decision for each n, the repetition first-time posterior value $\beta_n^{(l)}$ of the bit n is updated by the following Equation (11);

[Expression 8]

$$\beta_n^{(1)} = \lambda_n + \sum_{m' \in M(n)} \alpha_n^{(1)} \quad (11)$$

(Stop Regulation)

Thereafter, when the repetition first-time posterior value $\beta_n^{(l)}$ of the bit n is "$\beta_n^{(l)} > 0$", for example, a decoding result is "$x_n' = 1$" (where x' corresponds to the original transmission signal x). On the other hand, when "$\beta_n^{(l)} \leq 0$", a decoding result is "$x_n' = 0$", and a decoding result $x' = (x_1', x_2', \ldots, x_N')$ is obtained.

When the result of parity check is "Hx'=0" or when the number of repetitions is "$l = l_{max}$" (when any one of these condition is satisfied), a decoding result x' in this case is output. When none of the two conditions is satisfied, "l=l+1" is set, and the process control returns to the above row processing. Thereafter, the calculation is sequentially performed.

A characteristic operation of the LDPC decoder 5 that performs the above "Cyclic approximated min algorithm" is explained in detail with reference to a configuration diagram.

Figure 6:
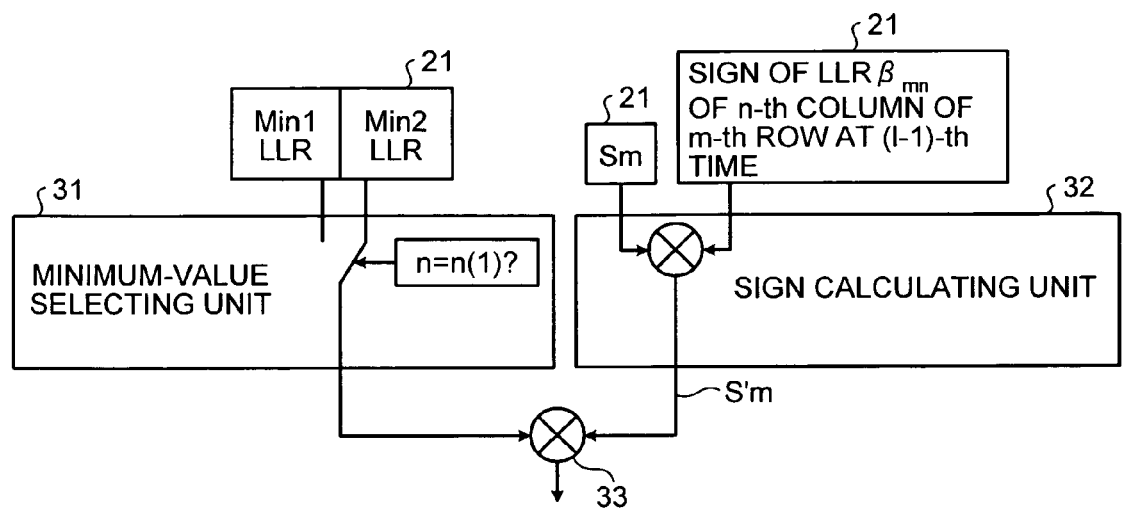
FIG. 6 is a configuration example of a row processing unit that performs row processing according to the "Cyclic approximated min algorithm".

FIG. 6 is a configuration example of the row processing unit 22 that performs row processing according to the "Cyclic approximated min algorithm". The row processing unit 22 includes a minimum-value selecting unit 31, a sign calculating unit 32, and an LLR calculating unit 33. In FIG. 6, a Min1LLR (minimum LLR of the m-th row) is $B_{mn(1)}$, a Min2LLR (second minimum LLR of the m-th row) is $B_{mn(2)}$, and these are the values retained in the intermediate-result retaining unit 21. In FIG. 6, $S_m$ and the "sign of the LLR: $\beta_{mn}$ of the m-th row and n-th column of the (l−1)-th time" are also the values retained in the intermediate-result retaining unit 21.

The minimum-value selecting unit 31 selects the Min2LLR($B_{mn(2)}$) when the column number n to be row-processed coincides with the column number n(1) of the Min1LLR($B_{mn(l)}$), and selects the Min1LLR($B_{mn(l)}$) in other cases, and outputs the selected result. The sign calculating unit 32 multiplies the "$S_m$ updated by the (l−1)-th time column processing" by the "sign of the LLR: $\beta_{mn}$ of the m-th row and n-th column of the (l−1)-th time", and outputs $S_m'$ as a result of the multiplication. In this case, $S_m'$ is retained in the intermediate-result retaining unit 21. The LLR calculating unit 33 multiplies the minimum LLR obtained from the minimum-value selecting unit 31 by the multiplication result $S_m'$ of the sign (+ or −) obtained from the sign calculating unit 32, thereby calculating LLR: $\alpha_{mn}^{(l)}$. Based on this, according to the "Min-Sum algorithm", the memory that has been necessary by the row weight portion can be reduced to the k value portion.

Figures 1, 7:
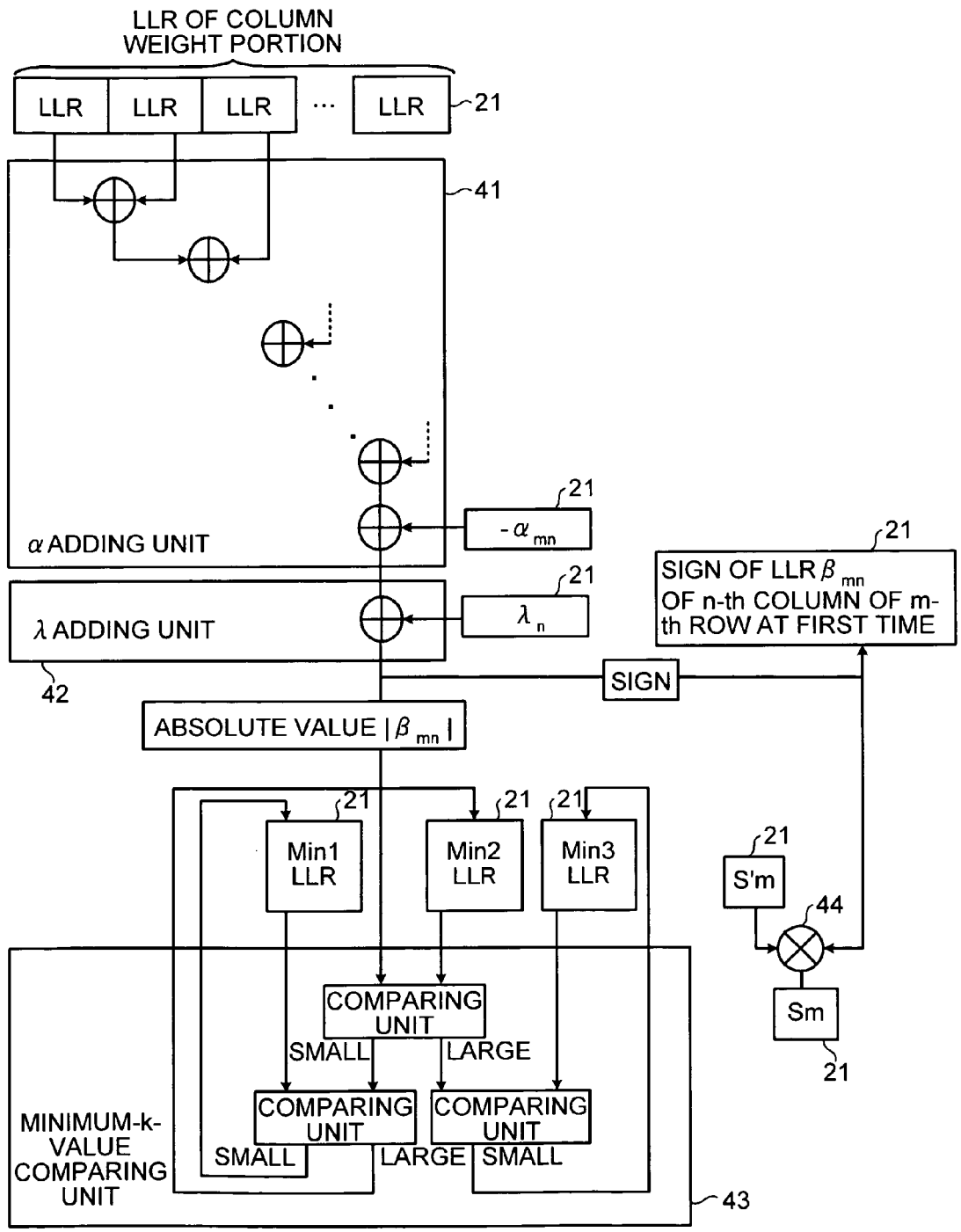
Figures 2, 7:
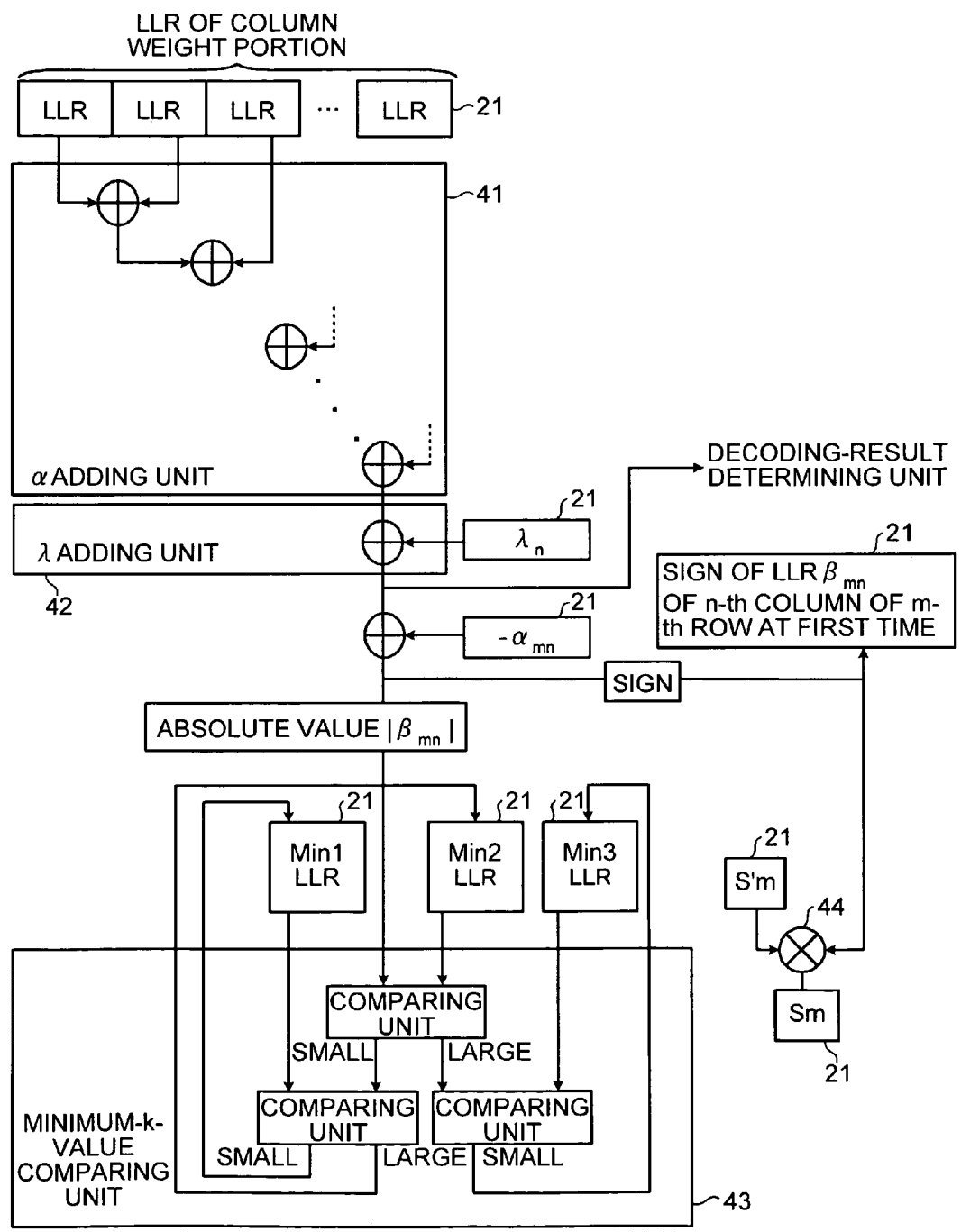

FIG. 7-1 is a configuration example of the column processing unit 23 that performs column processing according to the "Cyclic approximated min algorithm". This column processing unit 23 includes an α adding unit 41, a λ adding unit 42, a minimum-k-value comparing unit 43, and a sign calculating unit 44. In the present embodiment, k=3 is described as an example. In FIG. 7-1, LLR of a column weight portion, $\alpha_{mn}$, $\lambda_n$, $S_m'$, Min1LLR, Min2LLR, Min3LLR (the third-minimum LLR of the m-th row) are the values retained in the intermediate-result retaining unit 21.

Figure 8:
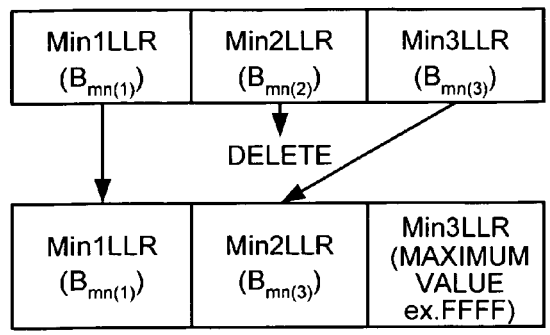
FIG. 8 is a schematic diagram for explaining column processing of n=15 when information of n=15 is held in a Min2LLR.

In the column processing unit 23, the α adding unit 41 adds all LLR: $\alpha_{m'n}$ other than those of the m-th row LLR updated in the first-time row processing. Further, the λ adding unit 42 adds the reception LLR: $\lambda_n$ to the result of the addition by the α adding unit 41, and outputs $\beta_{mn}^{(l)}$. The minimum-k-value comparing unit 43 (k=3) receives $|\beta_{mn}^{(l)}|$. Although not shown in FIG. 7-1, when n of the n-th column to be column processed coincides with any one of n(1), n(2), n(3) indicating the column numbers corresponding to $B_{mn(1)}$, $B_{mn(2)}$, $B_{mn(3)}$, held in the Min1LLR, Min2LLR, Min3LLR respectively, for example, $B_{mn(i)}$ of n=n(i) is thinned, and the operation as shown in FIG. 8 is performed. Specifically, information held in the Min2LLR is deleted, and information held in the Min3LLR is shifted to the Min2LLR. A maximum value "FFFF", for example (in the case of 16 bits), is stored in the Min3LLR. Accordingly, a comparison process excluding the column to be processed can be performed, and at least the Min3LLR can be necessarily updated by the column processing. After that, as shown in FIG. 7-1, $|_{mn}^{(l)}|$ is compared with each of the Min1LLR, Min2LLR, Min3LLR. When "$|\beta_{mn}^{(l)}|$ < Min3LLR", the LLR of the minimum 3 value is updated. On the other hand, the sign of $\beta_{mn}^{(l)}$ output by the λ adding unit 42 is retained in the intermediate-result retaining unit 21, as the "sign of the LLR: $\beta_{mn}^{(l)}$ of the m-th row and n-th column of the first time". Further, the sign calculating unit 44 multiplies $S_m'$ updated in the first-time row processing, by the sign of the above $\beta_{mn}^{(l)}$, and updates $S_m$ retained in the intermediate-result retaining unit 21, using a result of this multiplication. In comparing $|\beta_{mn}^{(l)}|$ with each of the Min1LLR, Min2LLR, Min3LLR, $|\beta_{mn}^{(l)}|$ is first compared with the Min2LLR as the center value of $B_{mn(i)}$, and thereafter, comparison is performed in a tree shape as shown in FIG. 7-1. For example, there is an effect that the execution time becomes $\{(k+1)/2\}/2$ (where k is an odd number), as compared with the effect when $|\beta_{mn}^{(l)}|$ is compared first with the Min1LLR that becomes the minimum value. When k is an even number, there are two center values of $B_{mn(i)}$. In this case, any one of the two values can be compared first. When k is an even number, there is an effect that the execution time becomes $\{k/2+1\}/k$ (where k is an even number), as compared with the effect when $|\beta mn^{(l)}|$ is compared first with the Min1LLR that becomes the minimum value.

The same process as described above can also be achieved with the configuration shown in FIG. 7-2. In this case, the α adding unit 41 performs only the addition of all the LLR of the column weight portion, and thereafter, the λ adding unit 42 adds $\lambda_n$, outputs a result of the addition to the decoding-result determining unit 24, and subtracts $\alpha_{mn}$ as the LLR of the m-th row. In this procedure, the same result as obtained in the above process can also be obtained. In this case, the configuration of the LDPC encoder becomes as shown in FIG. 5-2.

Figure 9:
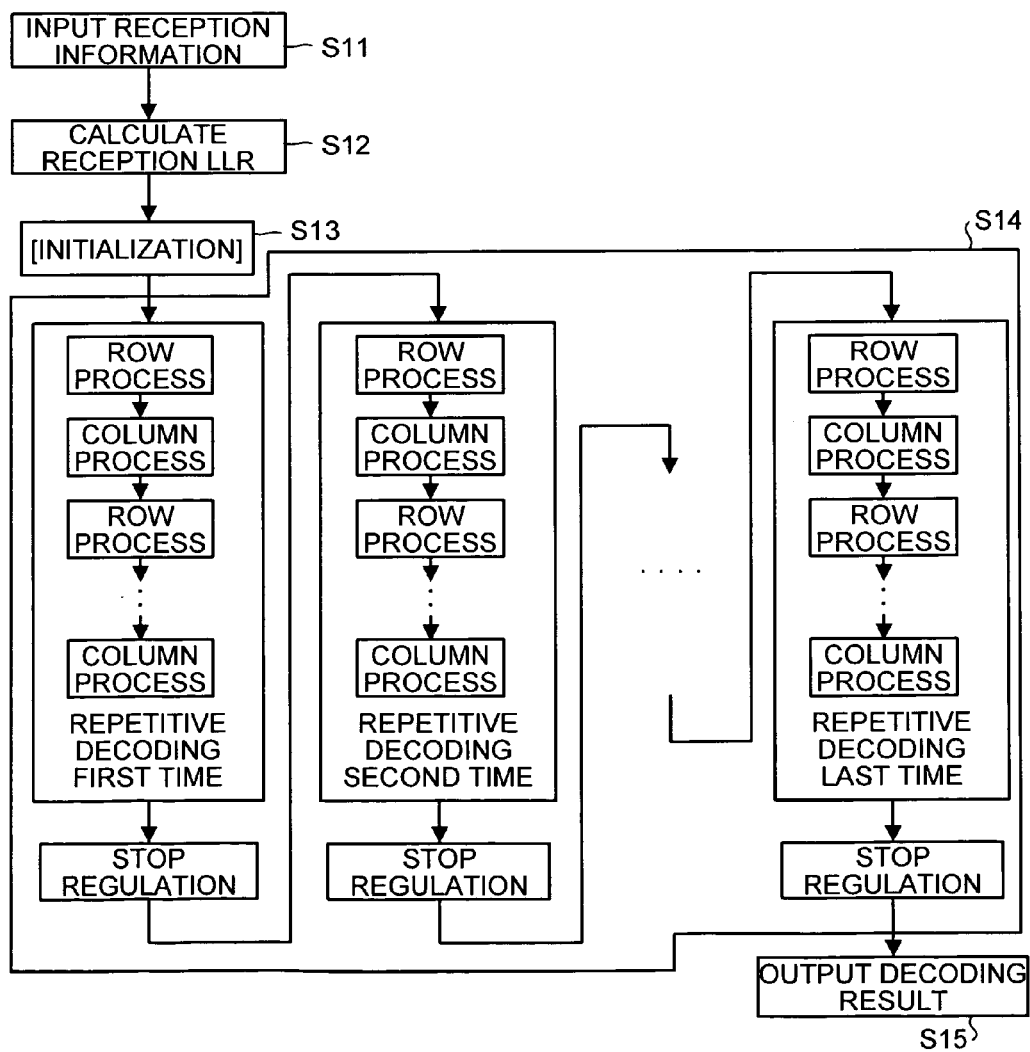
FIG. 9 is a flowchart of a process according to the "Cyclic approximated min algorithm".

The flow of the process in the "Cyclic approximated min algorithm" according to the present embodiment is explained with reference to FIG. 9.

According to the "Cyclic approximated min algorithm", the reception-LLR calculating unit 11 calculates the reception LLR from the reception information (steps S11, S12), and sets a result of the calculation to the intermediate-result retaining unit 21, as an initial value (step S13). The controller 25 initializes the number of repetitions as l=1 (step S13). The calculation of Equation (8) is cyclically performed from n=1 to n=N, using the λ adding unit 42, the minimum-k-value comparing unit 43, and the sign calculating unit 44, out of the column processing unit 23 (step S13).

Next, the decoding core unit 12 performs the first-time (first-time to the last-time) iterative decoding calculation (step S14). Specifically, as the first-time iterative decoding, the row processing unit 22 performs the row processing (using the reception LLR) to the row having "1" in the first column, and delivers a result of the calculation to the column processing unit 23. Thereafter, the column processing unit 23 performs the column processing of the first column, and retains (updates) $B_{mn(i)}$ and $S_m$, as a result of the calculation, in the intermediate-result retaining unit 21. Thereafter, processing similar to the above is performed in the order of the second column, third column, . . . , N-th column, and $B_{mn(i)}$ and $S_m$ are retained each time in the intermediate-result retaining unit 21 (corresponding to the iterative decoding first time). At the second and subsequent iterative decoding, the row processing is performed using the LLR and $S_m$ updated in the processing one before. In other cases, decoding is performed as in the first time.

After executing the first-time iterative decoding, the decoding-result determining unit 24 performs a hard decision on the posterior value calculated at the repetition first time, determines this determination value as the decoding result x', and performs a parity check (stop regulation). In the stop regulation, when a result of the parity check is OK ("Hx'=0") or when the number of repetitions is $l=1_{max}$, the decoding result x' at this time is finally output (step S15). When the above two conditions are not satisfied, the controller 25 sets l=l+1, and the decoding core unit 12 performs the (l+1)-th time iterative decoding.

Figure 10:
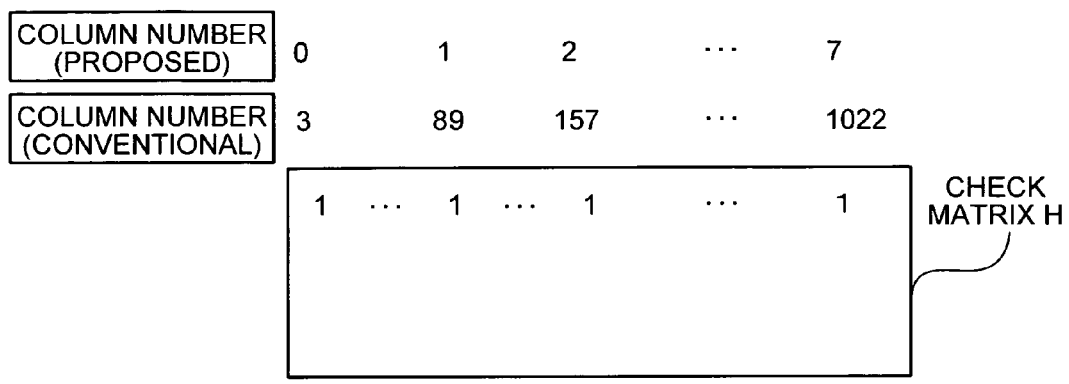
FIG. 10 is an example of column number notation.

Deletion of the memory size according to a notation method of a column number is explained next. FIG. 10 depicts a column number notation according to the present embodiment. In the "Cyclic approximated min algorithm", column numbers are noted in the ascending order from n=0, for example. Conventionally, a column number n is expressed as the column number itself (absolute column number) of the parity check matrix. However, in the present embodiment, column numbers are expressed as relative column numbers, such as a minimum column number of "1" of the m-th row in the parity check matrix is expressed as n=0, a column number of the next "1" of the m-th row is expressed as n=1, and thereafter, the column numbers are expressed as n=2, 3, . . . , at each "1". That is, conventionally, when the absolute column number of "1" in the parity check matrix is "32768", the number of bits necessary to express the column number is 15 bits. On the other hand, according to the present embodiment, when the row weight is eight, the memory size can be reduced to three bits which can express 0 to 7. When the row weight is 16, the memory size can be reduced to four bits which can express 0 to 15.

As described above, according to the present embodiment, the LDPC decoding is performed to minimize the absolute value $|\beta_{mn}|$ of the LLR for the row processing, to the minimum k value in row unit by the cyclic structure. Therefore, the memory capacity required to store the absolute values can be substantially reduced. When the row weight is 20 and also k=3, for example, the required memory capacity can be reduced to 3/20 of the conventional capacity. Further, by changing the column number from the absolute column number (1, 3, 10, 15 . . . ) to the relative column number (0, 1, 2, 3 . . . ), the required memory capacity can be further reduced.

In the "Cyclic approximated min algorithm" according to the present embodiment, calculation and updating of probability information (LLR) by the row processing and column processing are performed cyclically for each one bit. Accordingly, probability propagation can be performed more efficiently than that according to the conventional "Min-Sum algorithm".

Figure 11:
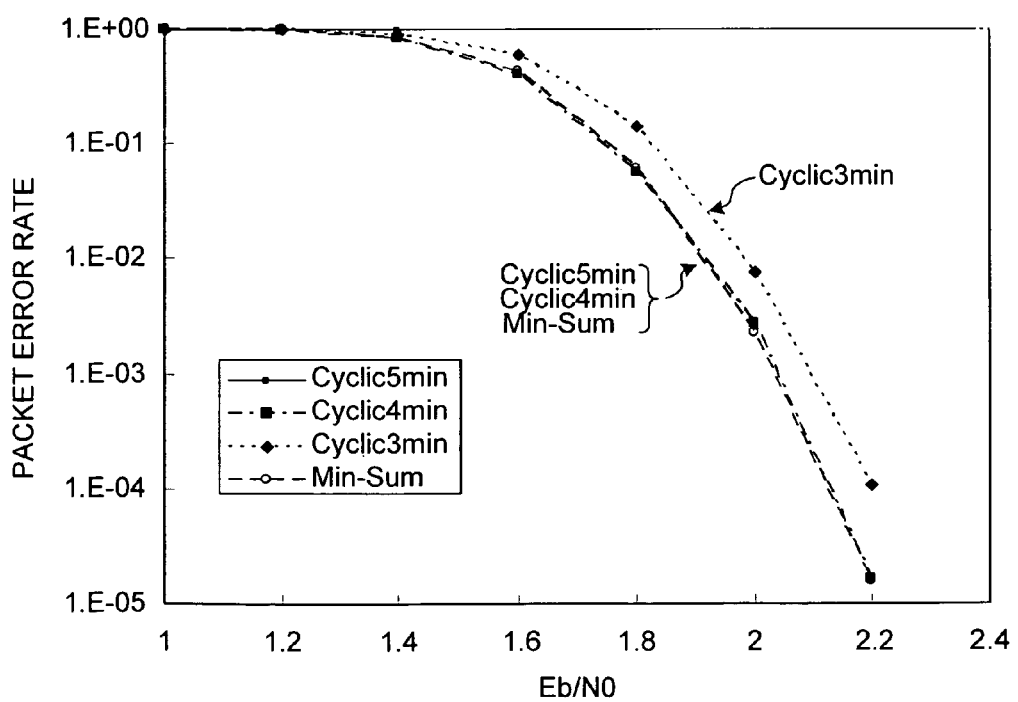
FIG. 11 is a graph of results of a comparison simulation between the "Cyclic approximated min algorithm" and the "Min-Sum algorithm".
Figure 12:
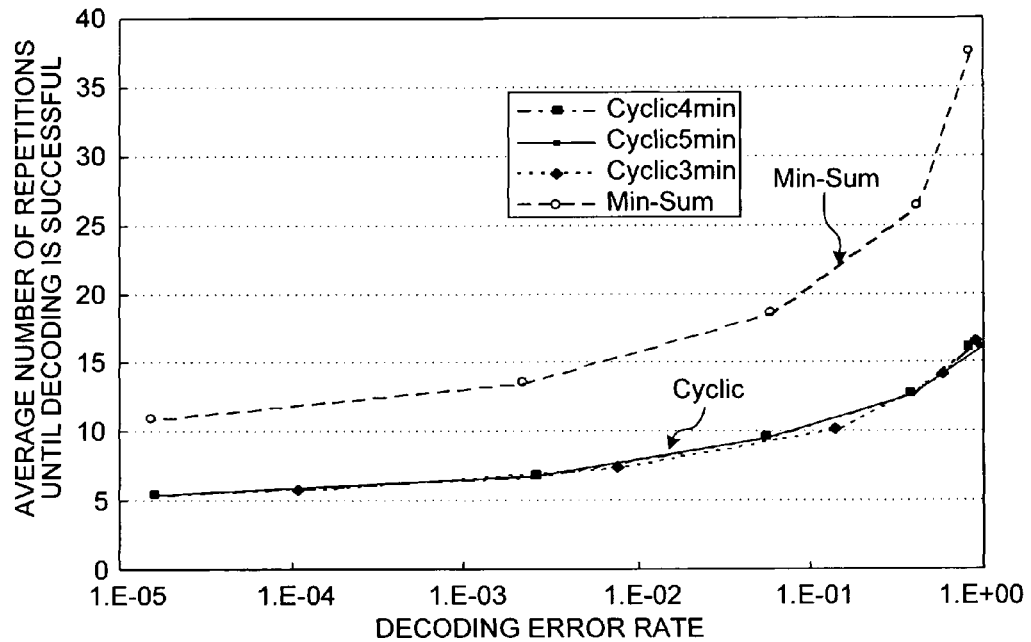
FIG. 12 is a graph of results of a comparison simulation between the "Cyclic approximated min algorithm" and the "Min-Sum algorithm".

For example, FIG. 11 and FIG. 12 depict results of a comparison simulation between the "Cyclic approximated min algorithm" and the "Min-Sum algorithm". An LDPC code has a maximum row weight of 8 in the irregular EG code. In FIG. 11, the number of decoding iterations is fixed to 100 times, and the number of minimum values stored in the "Cyclic approximated min algorithm" is changed to 3, 4, 5, and the performance is compared with that of the "Cyclic approximated min algorithm". In FIG. 11, CyclicX min is the "Cyclic approximated min algorithm" holding the minimum X value, and Min-Sum is the "Min-Sum algorithm". As is clear from FIG. 11, it can be confirmed that decoding performance is not degraded while decreasing the memory, by the "Cyclic approximated min algorithm" according to the present embodiment.

FIG. 12 depicts a result of comparing the average number of repetitions required until decoding succeeds, in the "Cyclic approximated min algorithm" and the "Min-Sum algorithm". In FIG. 12, CyclicX min is the "Cyclic approximated min algorithm" holding the minimum X value, and Min-Sum is the "Min-Sum algorithm". As is clear from this result, probability propagation is performed efficiently in the "Cyclic approximated min algorithm", and the decoding number of repetitions can be substantially reduced. That is, according to the present embodiment, the calculations in decoding can be substantially reduced by the "Cyclic approximated min algorithm".

While, in the present embodiment, the LLR to be row processed has one value, the k number can be any number equal to or higher than two values. The present embodiment explains, by way of example and without limitation, that the row processing and the column processing are performed one time alternately, and the updating of the probability information (LLR) by the row processing and the column processing is cyclically performed each one bit. Alternatively, after the row processing is performed a plurality of times, the column processing can be performed by a plurality of times. That is, calculation and updating of probability information (LLR) by the row processing and the column processing can be performed cyclically for a plurality of bits each time.

Second Embodiment

A receiving device and a decoding method according to a second embodiment are explained next. LDPC decoding according to the present embodiment can be applied when the calculation and updating of the probability information (LLR) by the row processing and column processing are performed for each one bit or a predetermined plurality of bits. For example, the number of repetitions can be reduced by parallelizing calculations. In the present embodiment, the "Cyclic approximated min algorithm" is executed using what is called "Overlapped" $B_{mn}{}^C$ and $S_m$, by arranging such that the $B_{mn(i)}$ and $S_m$ of the intermediate-result retaining unit are one set regardless of the number of parallelization, and parallelized all processing units update the same $B_{mn}{}^C$ and $S_m$. The decoding algorithm according to the present embodiment is hereinafter called the "Overlapped cyclic approximated min algorithm".

The "Overlapped cyclic approximated min algorithm" executed by the receiving device according to the present embodiment is shown below.

(Initialization Step)

First, the number of repetitions l=1 and the maximum number of repetitions $l_{max}$ are set. Further, a reception LLR: $\lambda_n$ is input, and $B_{mn(i)}{}^C$ is obtained as given by the following Equation (12), assuming an LLR of the minimum k value of the m-th row at the initial time is $\beta_{mn(i)}{}^{(0)}$. As a sign of the LLR: $\beta_{mn}{}^{(0)}$ in the m-th row at the initial time, sgn($\lambda$n) is input, and $S_m$ is obtained as shown by the following Equation (12):

[Expression 9]

$$B_{mn'}^C = |\beta_{mn(i)}^{(0)}| = \min_{n \in N(m)\setminus\{n(1),n(2),\ldots,n(i-1)\}}[|\lambda_n|], \quad (12)$$

$$\forall i \in [1, k]$$

$$S_m = \prod_{n \in N(m)} \text{sgn}(\lambda_n)$$

$$n(i) = \arg\min_{n \in N(m)\setminus\{n(1),n(2),\ldots,n(i-1)\}}[|\lambda_n|]$$

$$n(0) = \phi$$

where $B_{mn(i)}{}^C$ is an absolute value of the LLR: $\beta_{mn(i)}$ of the minimum k value of the m-th row and is used in common in the parallel processing, and n(i) is a column number of the minimum i-th LLR in $B_{mn(i)}{}^C$.

(Row Processing Step)

In the present embodiment, a starting column of each row processing is arbitrary. At the stage where the processing ends up to the final column, decoding is performed again cyclically from the first column. As the row processing, the repetition first-time LLR: $\alpha_{mn}{}^{(l)}$ of the bit n to be sent from the check node m to the bit node n is updated for 0≤g≤G−1, g·N$_G$+1≤n≤(g+1)·N$_G$, and for each m, where G is a parallel number, N$_G$ is a column number that each parallelized decoding circuit processes, and G·N$_g$=N, by the following Equation (13):

[Expression 10]

$$\alpha_{mn}^{(1)} = \prod_{\substack{n' \in N(m)\setminus n \\ n' < g \cdot N_G}} \text{sgn}(\beta_{mn'}^{(1)}) \cdot \prod_{\substack{n' \in N(m)\setminus n \\ n' > g \cdot N_G}} \text{sgn}(\beta_{mn'}^{(l-1)}) \cdot \min_{n' \in N_k(m)\setminus n}\lfloor B_{mn'}^C \rfloor \quad (13)$$

$$= S_m \cdot \text{sgn}(\beta_{mn}^{(l-1)}) \cdot \min_{n' \in N_k(m)\setminus n}[B_{mn'}^C]$$

$$= S_m' \cdot \min_{n' \in N_k(m)\setminus n}[B_{mn'}^C]$$

$$S_m' = S_m \cdot \text{sgn}(\beta_{mn}^{(l-1)})$$

Specifically, for example, G row processing units allocated to the G columns, into which the column is divided for each column number: N$_G$, perform the row processing in parallel. The G row processing units execute the parallel processing, and perform the same operation as that of the "Cyclic approximated min algorithm", except that all the processing units use the same $B_{mn}{}^C$.

(Column Processing Step)

Next, as the column processing, the repetition first-time LLR: $\beta_{mn}{}^{(l)}$ of the bit n to be sent from the bit node n to the check node m is updated for 0≤g≤G−1, g·N$_G$+1≤n≤(g+1)·N$_G$, and for each m by the following Equation (14). That is, in the present embodiment, after the row processing is performed in parallel as described above, for respective columns are performed in parallel the column processing represented by the following Equation (14):

[Expression 11]

$$\beta_{mn}^{(1)} = \lambda_n + \sum_{m' \in M(n)\setminus m} \alpha_{m'n}^{(1)} \quad (14)$$

$$S_m = S_m' \cdot \text{sgn}(\beta_{mn}^{(1)})$$

$$n(i) = \arg\min_{n' \in N_k(m)\setminus\{n(1),n(2),\ldots,n(i-1),n(i)\}}[B_{mn'}^C, |\beta_{mn}^{(1)}|]$$

$$B_{mn(i)}^C = \min_{n' \in N_k(m)\setminus\{n(1),n(2),\ldots,n(i-1),n(i)\}}[B_{mn'}^C, |\beta_{mn}^{(1)}|],$$

$$\forall i \in [1, k]$$

To perform a hard decision for each n, the repetition first-time posterior value $\beta_n{}^{(l)}$ of the bit n is updated by the following Equation (15):

[Expression 12]

$$\beta_n^{(1)} = \lambda_n + \sum_{m' \in M(n)} \alpha_n^{(1)} \quad (15)$$

The stop regulation is the same as that of the "Cyclic approximated min algorithm" described above.

Described below is a configuration and operation of the LDPC decoder 5 according to the second embodiment that achieves the above "Overlapped cyclic approximated min algorithm".

Figure 13:
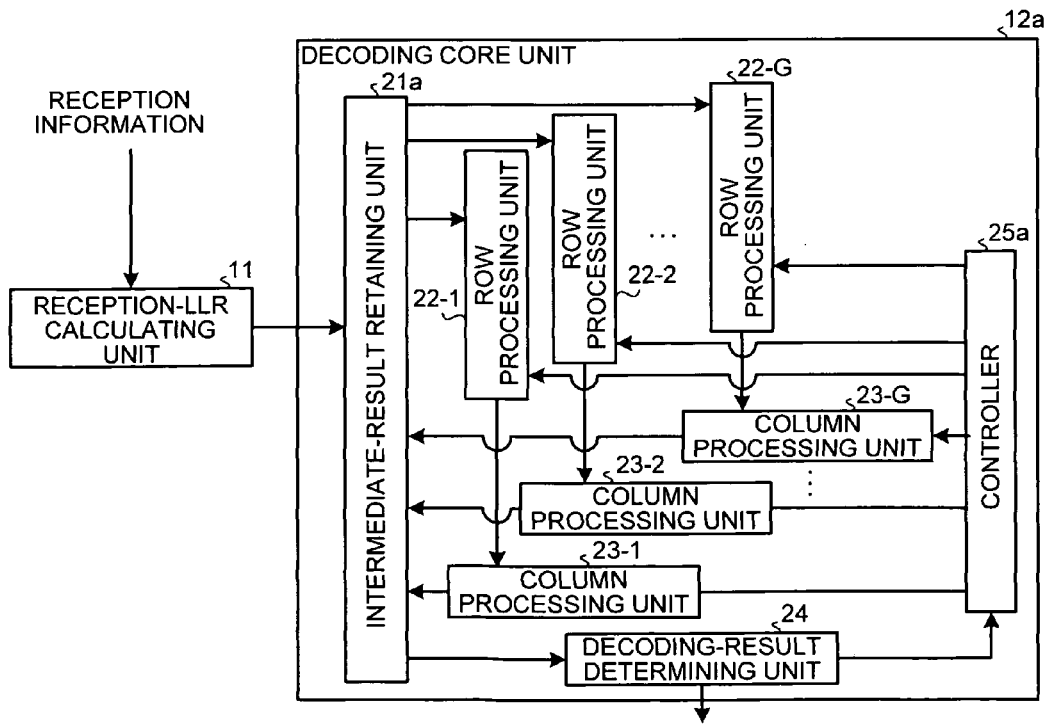
FIG. 13 is a configuration example of an LDPC decoder according to a second embodiment.

FIG. 13 is a configuration example of the LDPC decoder 5 according to the present embodiment. The LDPC decoder 5 includes the reception-LLR calculating unit 11 that calculates the reception LLR from the reception information, and a decoding core unit 12a that performs decoding of the present embodiment. The decoding core unit 12a includes an intermediate-result retaining unit 21a including a memory which stores therein an intermediate result (intermediate value) of decoding, row processing units 22-1 to 22-G that perform row processing (parallel processing) according to the present embodiment, column processing units 23-1 to 23-G that perform column processing (parallel processing) of the present embodiment, the decoding-result determining unit 24 that performs a hard decision of a posterior value in the column processing and an error determination of a parity check result, as a stop regulation according to the present embodiment, and a controller 25a that performs a repetition control of decoding.

In FIG. 13, the LDPC decoder 5 of the present embodiment uses in common $B_{mn}{}^C$ and $S_m$ retained by the intermediate-result retaining unit 21a following Equations (12), (13), and (14), when respective row processing units and respective column processing units perform processing in parallel, thereby updating $B_{mn}{}^C$ and $S_m$, respectively. With this parallel processing, $B_{mn}{}^C$ and $S_m$ are rapidly updated according to the parallel number, which substantially reduces the number of decoding iterations.

According to the present embodiment, in the parallel processing, when calculation of the same row occurs in the same clock and when the same buffer is referenced, various measures are taken, such as a memory access priority order is set to each processing unit, a memory bank is partitioned, and the timing of the memory access is adjusted using a shift register.

As described above, in the "Overlapped cyclic approximated min algorithm" according to the present embodiment, the row processing and the column processing are performed in parallel using the "Cyclic approximated min algorithm" described above. Further, the intermediate-result retaining unit that retains the minimum k value updated in each column processing performed in parallel is shared, and the minimum k value is updated in each column processing performed in parallel. With this arrangement, the number of decoding iterations can be substantially reduced as compared with the decrease according to the "Min-Sum algorithm" and the first embodiment described above.

Figure 14:
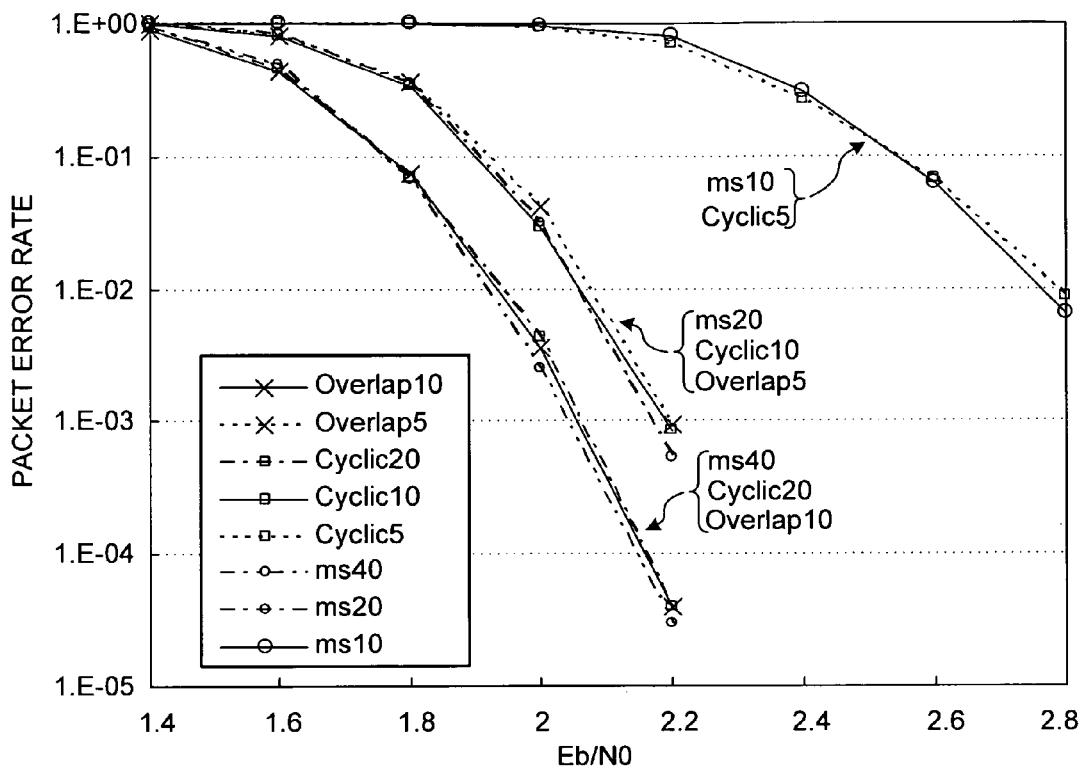
FIG. 14 is a graph of performance comparison regarding the number of repetitions.

FIG. 14 depicts a performance comparison regarding the number of repetitions. Specifically, the repetition performance of the "Overlapped cyclic approximated min algorithm" is compared with the repetition performance of the "Cyclic approximated min algorithm", and the "Min-Sum algorithm", respectively when the parallel number is 2, in the state that the number of decoding iterations is fixed. In FIG. 14, when the number of decoding iterations is limited to a small number, it can be confirmed that the decoding performance of the "Cyclic approximated min algorithm" is higher than the decoding performance of the conventional method of the "Min-Sum algorithm", and that the "Overlapped cyclic approximated min algorithm" has the decoding performance of the same level of the decoding performance by about the half number of decoding iterations of the "Cyclic approximated min algorithm". In FIG. 14, the number of decoding iterations is about a half because the parallel number is 2. When the "Overlapped cyclic approximated min algorithm" is used, the number of repetitions becomes "1/parallel number" of the "Cyclic approximated min algorithm".

Third Embodiment

A receiving device and a decoding method according to a third embodiment are explained below. In the present embodiment, the process of updating only the absolute value of the LLR of the minimum k value and the decoding using the approximate minimum value in the "Cyclic approximated min algorithm" according to the first embodiment or the "Overlapped cyclic approximated min algorithm" according to the second embodiment are cyclically applied to the "Normalized BP-based algorithm" as the known decoding algorithm using the "Min-Sum algorithm".

Before explaining the decoding algorithm of the present embodiment, the known "Normalized BP-based algorithm" that is the basis the decoding algorithm is shown below. The row processing different from that of the "Min-Sum algorithm" is explained.

(Row Processing Step)

The row processing of the above "Normalized BP-based algorithm" can be generalized by the following Equation (16). In this case, as the row processing, the repetition first-time LLR: $\alpha_{mn}^{(l)}$ is updated for each of m and n by the following Equation (16), where A is a constant called a normalization factor. In the "Normalized BP-based algorithm", the repetition first-time LLR obtained by the "Min-Sum algorithm" is corrected by the normalization factor A.

[Expression 13]

$$\alpha_{mn}^{(l)} = 2\tanh^{1}\left(\prod_{n' \in N(m)\backslash n} \tanh\left(\frac{\beta_{mn'}^{(l-1)}}{2}\right)\right) \quad (16)$$

$$= 2\tanh^{-1}\left(\prod_{n' \in N(m)\backslash n} \text{sgn}(\beta_{mn'}^{(l-1)}) \cdot \prod_{n' \in N(m)\backslash n} \tanh\left(\frac{|\beta_{mn'}^{(l-1)}|}{2}\right)\right)$$

$$= \prod_{n' \in N(m)\backslash n} \text{sgn}(\beta_{mn'}^{(l-1)}) \cdot 2\tanh^{-1}\left(\prod_{n' \in N(m)\backslash n} \tanh\left(\frac{|\beta_{mn'}^{(l-1)}|}{2}\right)\right)$$

$$\approx \frac{1}{A} \prod_{n' \in N(m)\backslash n} \text{sgn}(\beta_{mn'}^{(l-1)}) \cdot \min_{n' \in N(m)\backslash n} |\beta_{mn'}^{(l-1)}|$$

The decoding algorithm when the "Cyclic approximated min algorithm" or the "Overlapped cyclic approximated min algorithm" is applied to the "Normalized BP-based algorithm" is explained below. In the following, explanations are omitted for the processing (initialization, column processing, and stop regulation) similar to that of the "Cyclic approximated min algorithm" or the "Overlapped cyclic approximated min algorithm". The row processing different from that of the "Cyclic approximated min algorithm" or the "Overlapped cyclic approximated min algorithm" is explained below.

(Row Processing Step Using Cyclic Approximated Min Algorithm)

In the present embodiment, a starting column of the row processing is arbitrary. At the stage where the processing ends to the last column, decoding is performed again cyclically from the first column. The row processing of the decoding algorithm according to the present embodiment using the "Cyclic approximated min algorithm" can be generalized by the following Equation (17). In this case, as the row processing, the repetition first-time LLR: $\alpha_{mn}^{(l)}$ is updated for each of m and n by the following Equation (17). That is, the repetition first-time LLR obtained by the "Cyclic approximated min algorithm" is corrected by the normalization factor A in the following Equation (17):

[Expression 14]

$$\alpha_{mn}^{(l)} = \frac{1}{A} \prod_{\substack{n' \in N(m)\backslash n \\ n' < n}} \text{sgn}(\beta_{mn'}^{(l)}) \cdot \quad (17)$$

$$\prod_{\substack{n' \in N(m)\backslash n \\ n' > n}} \text{sgn}(\beta_{mn'}^{(l-1)}) \cdot \min_{n' \in N_k(m)\backslash n} [B_{mn'}]$$

$$= \frac{1}{A} S_m \cdot \text{sgn}(\beta_{mn}^{(l-1)}) \cdot \min_{n' \in N_k(m)\backslash n} [B_{mn'}]$$

$$= \frac{1}{A} S'_m \cdot \min_{n' \in N_k(m)\backslash n} [B_{mn'}].$$

(Row Processing Step Using Overlapped Cyclic Approximated Min Algorithm)

The row processing of the decoding algorithm according to the present embodiment using the "Overlapped cyclic approximated min algorithm" can be generalized by the following Equation (18). In this case, as the row processing, the repetition first-time LLR: $\alpha_{mn}^{(l)}$ is updated for $0 \leq g \leq G-1$, $g \cdot N_G + 1 \leq n \leq (g+1) \cdot N_G$, and for each m by the following Equation (18). That is, the repetition first-time LLR obtained by the "Overlapped cyclic approximated min algorithm" is corrected by the normalization factor A in the following Equation (18):

[Expression 15]

$$\alpha_{mn}^{(1)} = \frac{1}{A} \prod_{\substack{n' \in N(m) \setminus n \\ n' < g \cdot N_G}} \operatorname{sgn}(\beta_{mn'}^{(l-1)}) \cdot \prod_{\substack{n' \in N(m) \setminus n \\ n' > g \cdot N_G}} \operatorname{sgn}(\beta_{mn'}^{(l-1)}) \cdot \min_{n' \in N_k(m) \setminus n}[B_{mn'}^C] \quad (18)$$

$$= \frac{1}{A} S_m \cdot \operatorname{sgn}(\beta_{mn}^{(l-1)}) \cdot \min_{n' \in N_k(m) \setminus n}[B_{mn'}^C]$$

$$= \frac{1}{A} S'_m \cdot \min_{n' \in N_k(m) \setminus n}[B_{mn'}^C]$$

In the decoding algorithm according to the present embodiment, after the row processing step is performed as described above, processing based on the column processing and the stop regulation similar to those of the "Cyclic approximated min algorithm" or the "Overlapped cyclic approximated min algorithm" is performed to obtain the final code result.

Characteristic operations of the row processing unit of the LDPC decoder 5 that executes the decoding algorithm of the present embodiment are explained below with reference to the drawings. The entire configuration of the LDPC decoder 5 is similar to that shown in FIG. 5 or FIG. 13.

Figure 15:
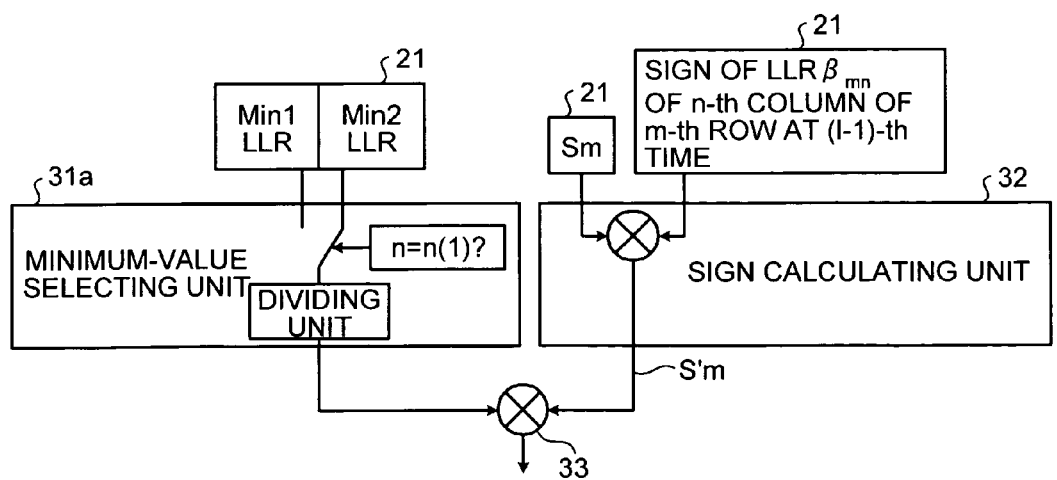
FIG. 15 is a configuration example of a row processing unit that performs row processing according to a third embodiment.

FIG. 15 is a configuration example of row processing units 22, 22-1 to 22-G that perform row processing of the present embodiment. The row processing unit includes a minimum-value selecting unit 31a. Configurations similar to those explained with reference to FIG. 6 are denoted by like reference numerals, and explanations thereof are not repeated. The minimum value selecting unit 31a according to the present embodiment corrects the minimum value (Min1LLR or Min2LLR) of the LLR read from the intermediate-result retaining unit 21 (or 21a), using the normalization factor A, for example. Specifically, the minimum value selecting unit 31a performs the normalization by dividing the LLR minimum value by A.

As described above, according to the present embodiment, the "Cyclic approximated min algorithm" or the "Overlapped cyclic approximated min algorithm" is applied to the "Normalized BP-based algorithm" having the better performance than that of the "Min-Sum algorithm". With this arrangement, effects similar to those of the first and second embodiments can be obtained. Further, performance close to that of the "Sum-Product algorithm" can be achieved, regardless of the circuit amount substantially equivalent to that of the "Min-Sum algorithm".

In the present embodiment, the "Cyclic approximated min algorithm" or the "Overlapped cyclic approximated min algorithm" is applied to the "Normalized BP-based algorithm". Alternatively, the "Cyclic approximated min algorithm" or the "Overlapped cyclic approximated min algorithm" can also be applied to the known "Offset BP-based algorithm" or other algorithm. In this case also, effects similar to those described above can be obtained.

Fourth Embodiment

A receiving device and a decoding method according to a fourth embodiment are explained below. In the present embodiment, the process of updating only the absolute value of the LLR of the minimum k value and the decoding using the approximate minimum value in the "Cyclic approximated min algorithm" according to the first embodiment or the "Overlapped cyclic approximated min algorithm" according to the second embodiment are cyclically applied to the "δ min algorithm" as the known decoding algorithm having superior correction performance of LLR: $\beta_{mn}$ to that of the "Normalized BP-based algorithm" or the "Offset BP-based algorithm".

Before explaining the decoding algorithm of the present embodiment, the known "δ min algorithm" that is the basis of the decoding algorithm is explained. The row processing different from that of the "Min-Sum algorithm" is explained below.

(Row Processing Step)

The row processing of the above "δ min algorithm" can be generalized by the following Equation (19). In this case, as the row processing, the repetition first-time LLR: $\alpha_{mn}^{(l)}$ is updated for each of m and n by the following Equation (19). In the row processing of the "δ min algorithm", $\alpha_{mn}^{(l)}$ is calculated by calculating $\Theta$ from the absolute value: $|\beta_{mn'}^{(i-1)}|$ of the LLR updated at the repetition l-1-th time.

[Expression 16]

$$\alpha_{m,n}^{(i)} = \prod_{n' \in N(m) \setminus n} \operatorname{sgn}(\beta_{mn'}^{(i-1)}) \cdot \underset{n' \in N(m) \setminus n}{\Theta}[|\beta_{m,n'}^{(i-1)}|] \quad (19)$$

$$\underset{n \in A}{\Theta}(I_n) \equiv I_1 \Theta I_2 \Theta \ldots \Theta I_{|A|}$$

$$a \Theta b \equiv \max(\min(a, b) - \Delta, 0)$$

$$\Delta \equiv \max(0.9 - |a - b|/2, 0)$$

The decoding algorithm when the "Cyclic approximated min algorithm" or the "Overlapped cyclic approximated min algorithm" is applied to the "δ min algorithm" is explained below. In the following, explanations are omitted for the processing (initialization, column processing, and stop regulation) similar to that of the "Cyclic approximated min algorithm" or the "Overlapped cyclic approximated min algorithm". The row processing different from that of the "Cyclic approximated min algorithm" or the "Overlapped cyclic approximated min algorithm" is explained below. In the present embodiment, a starting column of the row processing is arbitrary. At the stage where the processing ends to the last column, decoding is performed again cyclically from the first column.

(Row Processing Step Using Cyclic Approximated Min Algorithm)

For example, the row processing of the decoding algorithm according to the present embodiment using the "Cyclic approximated min algorithm" can be generalized by the following Equation (20). In this case, as the row processing, the repetition first-time LLR: $\alpha_{mn}^{(l)}$ is updated for $1 \leq n \leq N$ and for each m by the following Equation (20). In the row processing of the decoding algorithm, $\alpha_{mn}^{(l)}$ is calculated by calculating $\Theta$ from the absolute value: $B_{mn'}$ of the LLR of the minimum k value updated at the repetition l-1-th time.

[Expression 17]

$$\alpha_{mn}^{(1)} = \prod_{\substack{n' \in N(m)\backslash n \\ n' < n}} \text{sgn}(\beta_{mn'}^{(1)}) \cdot \prod_{\substack{n' \in N(m)\backslash n \\ n' > n}} \text{sgn}(\beta_{mn'}^{(l-1)}) \cdot \underset{n' \in N_k(m)\backslash n}{\Theta} [B_{mn'}] \quad (20)$$

$$= S_m \cdot \text{sgn}(\beta_{mn}^{(l-1)}) \cdot \underset{n' \in N_k(m)\backslash n}{\Theta} [B_{mn'}]$$

$$= S'_m \cdot \underset{n' \in N_k(m)\backslash n}{\Theta} [B_{mn'}]$$

(Row Processing Step Using Overlapped Cyclic Approximated Min Algorithm)

The row processing of the decoding algorithm according to the present embodiment using the "Overlapped cyclic approximated min algorithm" can be generalized by the following Equation (21). In this case, as the row processing, the repetition first-time LLR: $\alpha_{mn}^{(l)}$ is updated for $0 \leq g \leq G-1$, $g \cdot N_G + 1 \leq n \leq (g+1) \cdot N_G$, and for each m by the following Equation (21). In the row processing of this decoding algorithm, $\alpha_{mn}^{(l)}$ is calculated by calculating $\Theta$ from the absolute value: $\beta_{mn'}^C$ of the LLR of the minimum k value updated by the parallel processing at the repetition l−1-th time.

[Expression 18]

$$\alpha_{mn}^{(1)} = \prod_{\substack{n' \in N(m)\backslash n \\ n' < g \cdot N_G}} \text{sgn}(\beta_{mn'}^{(1)}) \cdot \prod_{\substack{n' \in N(m)\backslash n \\ n' > g \cdot N_G}} \text{sgn}(\beta_{mn'}^{(l-1)}) \cdot \underset{n' \in N_k(m)\backslash n}{\Theta} [B_{mn'}^C] \quad (21)$$

$$= S_m \cdot \text{sgn}(\beta_{mn}^{(l-1)}) \cdot \underset{n' \in N_k(m)\backslash n}{\Theta} [B_{mn'}^C]$$

$$= S'_m \cdot \underset{n' \in N_k(m)\backslash n}{\Theta} [B_{mn'}^C].$$

In the decoding algorithm according to the present embodiment, after the row processing step is performed as described above, processing based on the column processing and the stop regulation similar to those of the "Cyclic approximated min algorithm" or the "Overlapped cyclic approximated min algorithm" is performed to obtain the final code result.

Characteristic operations of the row processing unit of the LDPC decoder 5 that executes the decoding algorithm of the present embodiment are explained below with reference to the drawings. The entire configuration of the LDPC decoder 5 is similar to that shown in FIG. 5 or FIG. 13.

Figure 16:
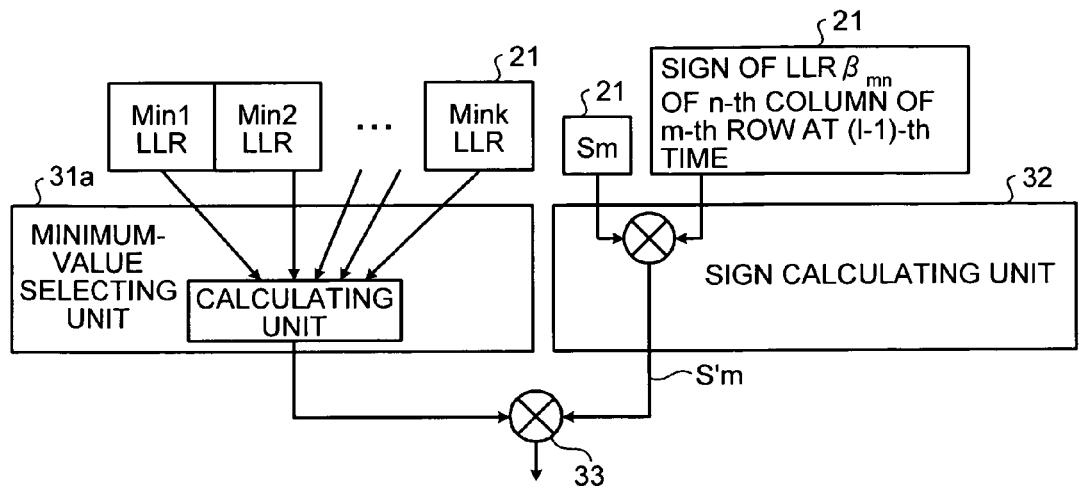
FIG. 16 is a configuration example of a row processing unit that performs row processing according to a fourth embodiment.

FIG. 16 is a configuration example of the row processing units 22, 22-1 to 22-G that perform row processing of the present embodiment. Constituent elements similar to those described with reference to FIG. 6 are denoted by like reference numerals, and explanations thereof are not repeated. While the LDPC decoder 5 shown in FIG. 5 is explained as one example, the present embodiment can also be similarly applied to the LDPC decoder 5 shown in FIG. 13.

A minimum-value selecting unit 31b according to the present embodiment reads the Min1LLR($B_{mn(1)}$), Min2LLR ($B_{mn(2)}$), MinkLLR($B_{mn(k)}$), and their column numbers from the intermediate-result retaining unit 21, and the calculating unit performs the $\Theta$ calculation. That is, in the minimum-value selecting unit 31b according to the present embodiment, the calculating unit performs the following calculation in the "δ min algorithm", to $B_{mn(k)}$ in which the n-th column to be processed does not coincide with the column number n(k) of $B_{mn(k)}$ retained in the intermediate-result retaining unit 21.

For example, the calculating unit obtains the updated value $|\alpha_{mn}^{(l)}| (=\Theta[(B_{mn'}])$ excluding the sign as represented by the following Equation (22):

[Expression 19]

$$\underset{n' \in N_k(m)\backslash n}{\Theta} [B_{mn'}] \quad (22)$$

Further, by limiting the LLR to be calculated from the k value to the minimum 3 values, calculations can be reduced. The calculating unit obtains the updated value $|\alpha_{mn}^{(l)}| (=\Theta [(B_{mn'}])$ excluding the sign as represented by the following Equation (23):

[Expression 20]

$$\text{if } (n = n_{(1)}) \underset{n' \in N_k(m)\backslash n}{\Theta} [B_{mn'}] = B_{mn(2)} \Theta B_{mn(3)} \quad (23)$$

$$\text{else if } (n = n_{(2)}) \underset{n' \in N_k(m)\backslash n}{\Theta} [B_{mn'}] = B_{mn(1)} \Theta B_{mn(3)}$$

$$\text{else } \underset{n' \in N_k(m)\backslash n}{\Theta} [B_{mn'}] = B_{mn(1)} \Theta B_{mn(2)}$$

While the LLR to be calculated is limited from the k value to the minimum 3 values in the above example, the embodiment can also be applied to the case that the LLR is limited to the minimum 4, 5, . . . values.

As described above, according to the present embodiment, the "Cyclic approximated min algorithm" or the "Overlapped cyclic approximated min algorithm" is applied to the "δ min algorithm" having the better performance than that of the "Min-Sum algorithm". With this arrangement, effects similar to those of the first and second embodiments can be obtained. Further, performance close to that of the "Sum-Product algorithm" can be achieved, regardless of the circuit amount substantially equivalent to that of the "Min-Sum algorithm". In the present embodiment, description is made for the case that the minimum value of the absolute values of the LLR for the row processing is corrected to the optimum value based on a predetermined correction equation prescribed by the known "δ min algorithm". However, the correction equation is not limited to this, and the correction equation prescribed by the algorithm other than the "δ min algorithm" can also be used. In this case also, effects similar to those described above can be obtained.

Figure 17:
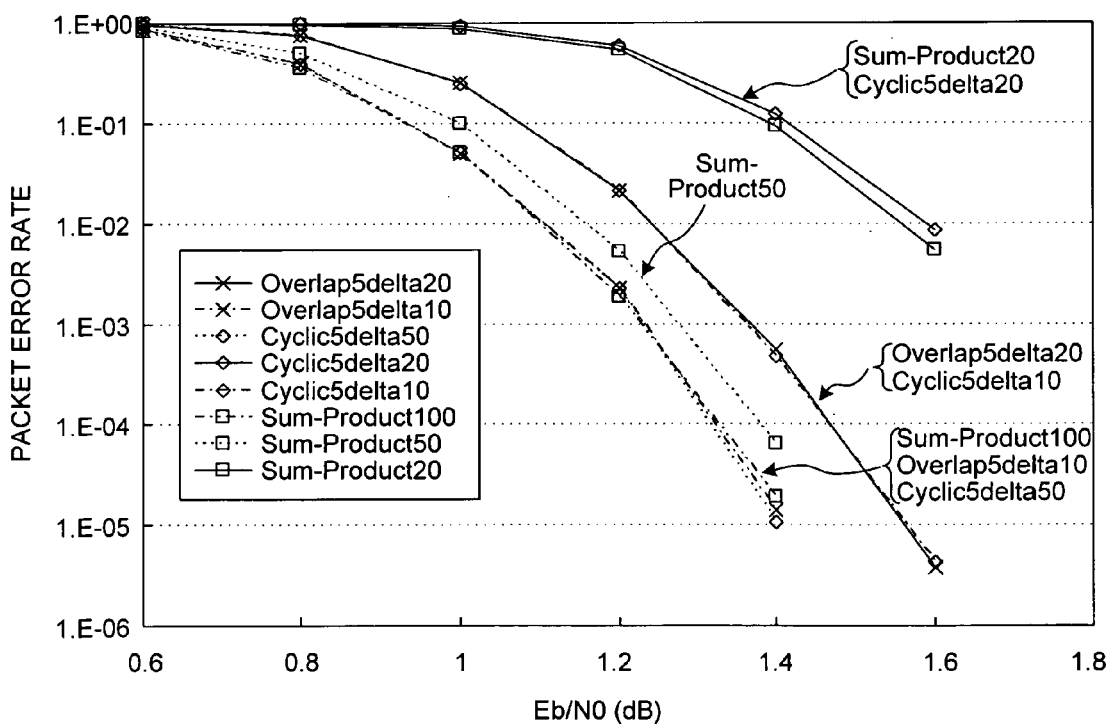
FIG. 17 is a graph of results of comparison between a decoding algorithm using the "Cyclic approximated min algorithm" or the "Overlapped cyclic approximated min algorithm" applied to the "δ min algorithm", and the "Sum-Product algorithm".

FIG. 17 depicts a result of comparison between a decoding algorithm having the "Cyclic approximated min algorithm" or the "Overlapped cyclic approximated min algorithm" applied to the "δ min algorithm" and the "Sum-Product algorithm". For example, overlap5delta10 is a decoding algorithm (parallel number: 2, minimum 5 values, l=10) according to the present embodiment using the "Overlapped cyclic approximated min algorithm", and Cyclic5delta50 is a decoding algorithm (without parallel, minimum 5 values, l=50) according to the present embodiment using the "Cyclic approximated min algorithm". Sum-Product100 is the "Sum-Product algorithm" (l=100). These are substantially overlapped. From this result, by applying the "Cyclic approximated min algorithm" or the "Overlapped cyclic approximated min algorithm" to the "δ min algorithm", performance approximately the same as that of the "Sum-Product algorithm" can be obtained. Further, the number of decoding iterations can also be substantially reduced.

Fifth Embodiment

A receiving device and a decoding method according to a fifth embodiment are explained below. In the present embodiment, the process of updating only the absolute value of the LLR of the minimum k value and the decoding using the approximate minimum value in the "Cyclic approximated min algorithm" according to the first embodiment or the "Overlapped cyclic approximated min algorithm" according to the second embodiment are cyclically applied to the "Sum-Product algorithm".

Before explaining the decoding algorithm of the present embodiment, the known "Sum-Product algorithm" that is the basis of the decoding algorithm is explained. In the present embodiment, a method of calculation by tabling the mathematical function, i.e., a general "Sum-Product algorithm" using a TLU (table lookup), is described. The row processing different from that of the "Sum-Product algorithm" explained in the conventional technology is described.

(Row Processing Step (1))

The row processing of the "Sum-Product algorithm" using the TLU can be generalized by the following Equation (24). In this case, as the row processing, the repetition first-time LLR: $\alpha_{mn}^{(l)}$ is updated for each of m and n by the following Equation (24). In the row processing of the "Sum-Product algorithm" using the TLU, a calculation using the TLU is performed to the absolute value: $|\beta_{mn'}^{(l-1)}|$ of the LLR updated at the repetition l−1-th time.

[Expression 21]

$$\alpha_{m,n}^{(i)} = \prod_{n' \in N(m)\backslash n} \mathrm{sgn}(\beta_{mn'}^{(i-1)}) \cdot \underset{n' \in N(m)\backslash n}{TLU} [|\beta_{m,n'}^{(i-1)}|] \quad (24)$$

$$\underset{n \in A}{TLU}(I_n) \equiv TLU(I_1, TLU(I_2, \ldots TLU(I_{|A|-1}, I_{|A|})))$$

$$TLU(a, b) \equiv 2\tanh^{-1}\left(\tanh\frac{a}{2} \cdot \tanh\frac{b}{2}\right)$$

(Row Processing Step (2))

The row processing of the "Sum-Product algorithm" using the TLU can also be achieved by the method different from the above method. For example, the row processing of the "Sum-Product algorithm" using the TLU different from the above method can be generalized by the following Equation (25). In this case, as the row processing, the repetition first-time LLR: $\alpha_{mn}^{(l)}$ is updated for each of m and n by the following Equation (25):

[Expression 22]

$$\alpha_{m,n}^{(i)} = \prod_{n' \in N(m)\backslash n} \mathrm{sgn}(\beta_{mn'}^{(i-1)}) \cdot \underset{n' \in N(m)\backslash n}{\Xi} [|\beta_{m,n'}^{(i-1)}|] \quad (25)$$

$$\underset{n \in A}{\Xi}(I_n) \equiv I_1 \Xi I_2 \Theta \ldots \Xi I_{|A|}$$

$$a \Xi b \equiv \min(a, b) + TLU1(|a+b|) - TLU1(|a-b|)$$

For the TLU1(x), a table is prepared in advance based on the following Equation (26):

$$TLU1(x) = \ln(1+\exp(-x)) \quad (26)$$

In the "Sum-Product algorithm" using the TLU, the row processing represented by Equation (24) has a characteristic that while the table becomes large, the number of calculations is small. On the other hand, the row processing represented by Equation (25) has a characteristic that the number of calculations is large although the table becomes small.

The decoding algorithm when the "Cyclic approximated min algorithm" is applied to the "Sum-Product algorithm" using the TLU is explained below. In the following, explanations are omitted for the processing (initialization, column processing, and stop regulation) similar to that of the "Cyclic approximated min algorithm". The row processing different from that of the "Cyclic approximated min algorithm" is explained below. In the present embodiment, a starting column of the row processing is arbitrary, and at the stage where the processing ends up to the final column, decoding is performed again cyclically from the first column.

(Row Processing Step Using Cyclic Approximated Min Algorithm (1))

The row processing of the decoding algorithm according to the present embodiment having the "Cyclic approximated min algorithm" applied to the above row processing step (1) can be generalized by the following Equation (27). In this case, as the row processing, the repetition first-time LLR: $\alpha_{mn}^{(l)}$ is updated for $1 \leq n \leq N$ and for each m by the following Equation (27). In the row processing of the decoding algorithm, a calculation using the TLU is performed to the absolute value: $B_{mn'}$ of the LLR of the minimum k value updated at the repetition l−1-th time.

[Expression 23]

$$\alpha_{mn}^{(1)} = \prod_{\substack{n' \in N(m)\backslash n \\ n' < n}} \mathrm{sgn}(\beta_{mn'}^{(1)}) \cdot \prod_{\substack{n' \in N(m)\backslash n \\ n' > n}} \mathrm{sgn}(\beta_{mn'}^{(l-1)}) \cdot \underset{n' \in N_k(m)\backslash n}{TLU} [B_{mn'}] \quad (27)$$

$$= S_m \cdot \mathrm{sgn}(\beta_{mn}^{(l-1)}) \cdot \underset{n' \in N_k(m)\backslash n}{TLU} [B_{mn'}]$$

$$= S'_m \cdot \underset{n' \in N_k(m)\backslash n}{TLU} [B_{mn'}]$$

(Row Processing Step Using Cyclic Approximated Min Algorithm (2))

The row processing of the decoding algorithm according to the present embodiment having the "Cyclic approximated min algorithm" applied to the above row processing step (2) can be generalized by the following Equation (28). In this case, as the row processing, the repetition first-time LLR: $\alpha_{mn}^{(l)}$ is updated for $1 \leq n \leq N$ and for each m by the following Equation (28):

[Expression 24]

$$\alpha_{mn}^{(1)} = \prod_{\substack{n' \in N(m)\backslash n \\ n' < n}} \mathrm{sgn}(\beta_{mn'}^{(1)}) \cdot \prod_{\substack{n' \in N(m)\backslash n \\ n' > n}} \mathrm{sgn}(\beta_{mn'}^{(l-1)}) \cdot \underset{n' \in N_k(m)\backslash n}{\Xi} [B_{mn'}] \quad (28)$$

$$= S_m \cdot \mathrm{sgn}(\beta_{mn}^{(l-1)}) \cdot \underset{n' \in N_k(m)\backslash n}{\Xi} [B_{mn'}]$$

$$= S'_m \cdot \underset{n' \in N_k(m)\backslash n}{\Xi} [B_{mn'}]$$

The decoding algorithm when the "Overlapped cyclic approximated min algorithm" is applied to the "Sum-Product algorithm" using the TLU is explained below. In the following, explanations are omitted for the processing (initialization, column processing, and stop regulation) similar to that of the "Overlapped cyclic approximated min algorithm". The row processing different from that of the "Overlapped cyclic approximated min algorithm" is explained below.

(Row Processing Step Using Overlapped Cyclic Approximated Min Algorithm (1))

The row processing of the decoding algorithm according to the present embodiment having the "Overlapped cyclic approximated min algorithm" applied to the above row processing step (1) can be generalized by the following Equation (29). In this case, as the row processing, the repetition first-time LLR: $\alpha_{mn}^{(l)}$ is updated for $0 \leq g \leq G-1$, $g \cdot N_G + 1 \leq n \leq (g+1) \cdot N_G$, and for each m by the following Equation (29). In the row processing of this decoding algorithm, a calculation using the TLU is performed to the absolute value: $B_{mn'}^C$ of the LLR of the minimum k value updated by the parallel processing at the repetition l−1-th time.

[Expression 25]

$$\alpha_{mn}^{(1)} = \prod_{\substack{n' \in N(m) \backslash n \\ n' < g \cdot N_G}} \mathrm{sgn}(\beta_{mn'}^{(1)}) \cdot \prod_{\substack{n' \in N(m) \backslash n \\ n' > g \cdot N_G}} \mathrm{sgn}(\beta_{mn'}^{(l-1)}) \cdot \underset{n' \in N_k(m) \backslash n}{TLU} [B_{mn'}^C] \quad (29)$$

$$= S_m \cdot \mathrm{sgn}(\beta_{mn}^{(l-1)}) \cdot \underset{n' \in N_k(m) \backslash n}{TLU} [B_{mn'}^C]$$

$$= S_m' \cdot \underset{n' \in N_k(m) \backslash n}{TLU} [B_{mn'}^C]$$

(Row Processing Step Using Overlapped Cyclic Approximated Min Algorithm (2))

The row processing of the decoding algorithm according to the present embodiment having the "Overlapped cyclic approximated min algorithm" applied to the above row processing step (2) can be generalized by the following Equation (30). In this case, as the row processing, the repetition first-time LLR: $\alpha_{mn}^{(l)}$ is updated for $0 \leq g \leq G-1$, $g \cdot N_G + 1 \leq n \leq (g+1) \cdot N_G$, and for each m by the following Equation (30):

[Expression 26]

$$\alpha_{mn}^{(1)} = \prod_{\substack{n' \in N(m) \backslash n \\ n' < g \cdot N_G}} \mathrm{sgn}(\beta_{mn'}^{(1)}) \cdot \prod_{\substack{n' \in N(m) \backslash n \\ n' > g \cdot N_G}} \mathrm{sgn}(\beta_{mn'}^{(l-1)}) \cdot \underset{n' \in N_k(m) \backslash n}{\Xi} [B_{mn'}^C] \quad (30)$$

$$= S_m \cdot \mathrm{sgn}(\beta_{mn}^{(l-1)}) \cdot \underset{n' \in N_k(m) \backslash n}{\Xi} [B_{mn'}^C]$$

$$= S_m' \cdot \underset{n' \in N_k(m) \backslash n}{\Xi} [B_{mn'}^C]$$

Characteristic operations of the row processing unit of the LDPC decoder 5 that executes the decoding algorithm of the present embodiment are explained below with reference to the drawings. The entire configuration of the LDPC decoder 5 is similar to that shown in FIG. 5 or FIG. 13.

Figure 18:
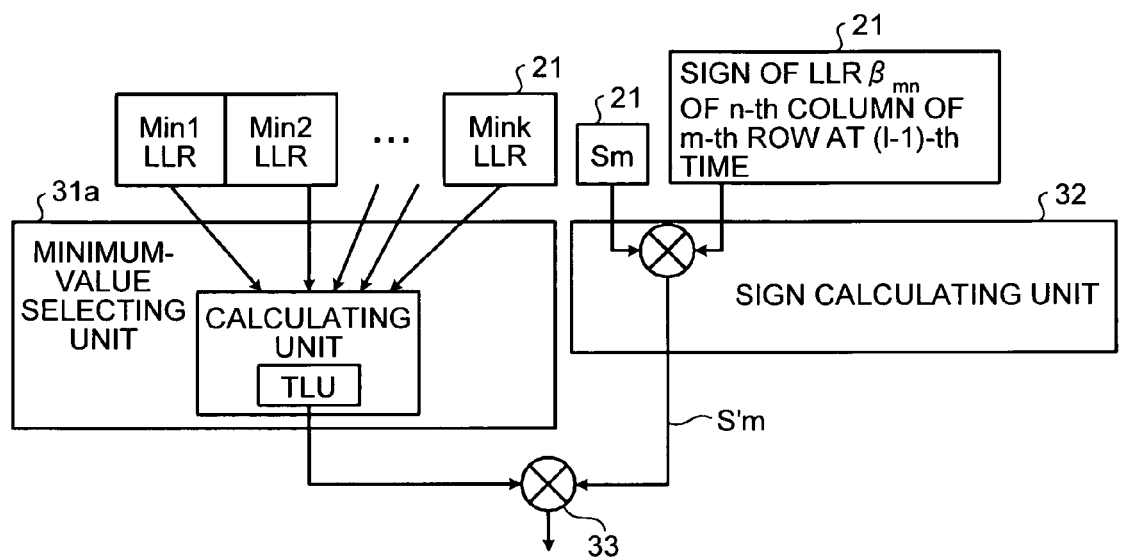
FIG. 18 is a configuration example of a row processing unit that performs row processing according to a fifth embodiment.

FIG. 18 is a configuration example of the row processing units 22, 22-1 to 22-G that perform row processing of the present embodiment. Constituent elements similar to those described with reference to FIG. 6 are denoted by like reference numerals, and explanations thereof are not repeated. While the LDPC decoder 5 shown in FIG. 5 is explained as one example, the present embodiment can also be similarly applied to the LDPC decoder 5 shown in FIG. 13.

A minimum-value selecting unit 31c according to the present embodiment reads the Min1LLR($B_{mn(1)}$), Min2LLR($B_{mn(2)}$), MinkLLR($B_{mn(k)}$), and their column numbers from the intermediate-result retaining unit 21, and the calculating unit performs calculation using the TLU. That is, in the minimum-value selecting unit 31c according to the present embodiment, the calculating unit performs the following calculation in the "Sum-Product min algorithm", to $B_{mn(k)}$ in which the n-th column to be processed does not coincide with the column number n(k) of $B_{mn(k)}$ retained in the intermediate-result retaining unit 21.

For example, the calculating unit obtains the updated value excluding the sign as represented by the following Equation (31):

[Expression 27]

$$\underset{n' \in N_k(m) \backslash n}{TLU} [B_{mn'}] \quad \text{OR} \quad \underset{n' \in N_k(m) \backslash n}{\Xi} [B_{mn'}] \quad (31)$$

Further, by limiting the LLR to be calculated from the k value to the minimum 3 values, calculations can be reduced. The calculating unit obtains the updated value excluding the sign as represented by the following Equation (32):

[Expression 28]

$$\text{if } (n = n_{(1)}) \underset{n' \in N_k(m) \backslash n}{TLU} [B_{mn'}] = TLU(B_{mn(2)}, B_{mn(3)}) \text{ OR} \quad (32)$$

$$\underset{n' \in N_k(m) \backslash n}{\Xi} [B_{mn'}] = B_{mn(2)} \Xi B_{mn(3)}$$

else if $$(n = n_{(2)}) \underset{n' \in N_k(m) \backslash n}{TLU} [B_{mn'}] = TLU(B_{mn(1)}, B_{mn(3)}) \text{ OR}$$

$$\underset{n' \in N_k(m) \backslash n}{\Xi} [B_{mn'}] = B_{mn(1)} \Xi B_{mn(3)}$$

else $\underset{n' \in N_k(m) \backslash n}{TLU} [B_{mn'}] = TLU(B_{mn(1)}, B_{mn(2)})$ OR $$\underset{n' \in N_k(m) \backslash n}{\Xi} [B_{mn'}] = B_{mn(1)} \Xi B_{mn(2)}$$

While the LLR to be calculated is limited from the k value to the minimum 3 values in the above explanation as an example, the embodiment can also be applied to the case that the LLR is limited to the minimum 4, 5, . . . values.

As described above, according to the present embodiment, the "Cyclic approximated min algorithm" or the "Overlapped cyclic approximated min algorithm" is applied to the "Sum-Product algorithm" using the TLU. With this arrangement, although calculations and the required memory capacity increase as compared with other embodiments, decoding performance can be improved. While the "Sum-Product algorithm" using the TLU is explained in the present embodiment, the principle can be similarly applied to other decoding algorithm for performing the TLU to the mathematical function. In the present embodiment, the TLU prescribed by the known "Sum-Product algorithm" is used for the minimum value of the absolute values of the LLR for the row processing. However, the TLU is not limited to the above, and the TLU other than the TLU prescribed by the "Sum-Product algorithm" can also be used. In this case also, effects similar to the above effects can be obtained.

Sixth Embodiment

A communication apparatus and a decoding method according to a sixth embodiment are explained below. According to the present embodiment, the number of repetitions can be further reduced by relating the decoding to a serial decoding in a complete bit unit.

As in the above embodiment, FIG. 5-1 depicts a configuration of the LDPC decoder 5 according to the present embodiment. The LDPC decoder 5 includes the reception-LLR calculating unit 11 that calculates the reception LLR from the reception information, and the decoding core unit 12 that performs decoding according to the present embodiment. The decoding core unit 12 includes the intermediate-result retaining unit 21 configured by a memory which stores therein an intermediate result (intermediate value) of decoding, the row processing unit 22 that performs row processing according to the present embodiment, the column processing unit 23 that performs column processing according to the present embodiment, the decoding-result determining unit 24 that performs a hard decision of a posterior value in the column processing and an error determination of a parity check result, as a stop regulation according to the present embodiment, and the controller 25 that performs a repetition control of decoding.

The decoding algorithm according to the present embodiment is a method of cyclically updating only the absolute value of the LLR of the minimum k value. Because this algorithm is the method of decoding using an approximate minimum value instead of an accurately minimum value and is the serial decoding method, this algorithm is hereinafter called the "Serial cyclic approximated min algorithm". The minimum k value represents "from the minimum value to the k-th value in the ascending order.

The "Serial cyclic approximated min algorithm" executed in the receiving device is shown below.

(Initialization Step)

First, the number of repetitions l=1 and the maximum number of repetitions $l_{max}$ are set. The LLR of the minimum k value of the m-th row at the initial time is set as $\beta_{mn(i)}^{(0)}$, and a reception LLR: $\lambda_n$ is input, thereby obtaining $B_{mn(i)}$ as represented by the following Equation (33). As a sign of the LLR: $\beta_{mn}^{(0)}$ of the m-th row at the initial time, sgn($\lambda_n$) is input, thereby obtaining $S_m$ as represented by the following Equation (33):

[Expressing 29]

$$B_{mn(i)} = |\beta_{mn(i)}^{(0)}| = \min_{n \in N(m) \setminus \{n(1), n(2), \ldots, n(i-1)\}} [|\lambda_n|], \forall i \in [1, k] \quad (33)$$

$$S_m = \prod_{n \in N(m)} \text{sgn}(\lambda_n)$$

$$n(i) = \arg \min_{n \in N(m) \setminus \{n(1), n(2), \ldots, n(i-1)\}} [|\lambda_n|]$$

$$n(0) = \phi$$

where $B_{mn(i)}$ is an absolute value of the LLR: $B_{mn(i)}$ of the minimum k value of the m-th row, n(i) is a column number of the minimum i-th LLR in $B_{mn(i)}$, and $S_m$ is a product of signs (+ or −) of the LLR: $\beta_{mn}$ of the m-th row.

(Row Processing Step 1)

In the present embodiment, a starting column of the row processing is arbitrary. At the stage where the processing ends to the last column, decoding is performed again cyclically from the first column. As the row processing, the repetition first-time LLR: $\alpha_{mn}^{(l)}$ of the bit n to be sent from the check node m to the bit node n is updated for $1 \leq n \leq N$ and for each m by the following Equation (34):

[Expression 30]

$$\alpha_{mn}^{(l)} = \prod_{\substack{n' \in N(m) \setminus n \\ n' < n}} \text{sgn}(\beta_{mn'}^{(l)}) \cdot \qquad (34)$$

$$\prod_{\substack{n' \in N(m) \setminus n \\ n' > n}} \text{sgn}(\beta_{mn'}^{(l-1)}) \cdot \min_{n' \in N_k(m) \setminus n} [B_{mn'}]$$

$$= S_m \cdot \text{sgn}(\beta_{mn}^{(l-1)}) \cdot \min_{n' \in N_k(m) \setminus n} [B_{mn'}]$$

$$= S'_m \cdot \min_{n' \in N_k(m) \setminus n} [B_{mn'}]$$

$$S'_m = S_m \cdot \text{sgn}(\beta_{mn}^{(l-1)})$$

$$\beta_n^{(l)} = \lambda_n + \sum_{m \in M(n)} \alpha_{mn}^{(l)}$$

Specifically, when the current column number is n, a column number that satisfies "n'<n" takes the product of signs of the LLR: $\beta_{mn'}^{(l)}$ updated in the first-time column processing, and a column number that satisfies "n'>n" takes the product of signs of the LLR: $\beta_{mn'}^{(l-1)}$ updated in the (l−1)-th time column processing. A result of multiplying these results by the minimum LLR: min[$\beta_{mn'}$] in the minimum k value of the m-th row is set as the updated LLR: $\beta_{mn}^{(l)}$ of the column number n. In the present embodiment, the term of multiplying the product of the signs of $\beta_{mn'}^{(l)}$ by the product of the signs of $\beta_{mn'}^{(l-1)}$ is substituted by the term of multiplying $S_m$ updated at the (l−1)-th time by the sign of $\beta_{mn'}$ updated at the (l−1)-th time. With this arrangement, calculations and the required memory capacity can be reduced. $N_k(m)$ in Equation (34) is the set of n(i) of the m-th row, and is expressed as $N_k(m)=\{n(1), n(2), \ldots, n(k)\}$ (Column Processing Step)

Next, as the column processing, the repetition first-time LLR: $\beta_{mn}^{(l)}$ of the bit n to be sent from the bit node n to the check node m is updated by the following Equation (35) for each m of the column number n performed at the row processing step 1. At the subsequent column processing step and the row processing step 2, calculation is performed in order for each row starting from the one with the smallest row number, for example. However, when all rows having "1" standing are executed without overlapping, the calculation can be performed in any order.

[Expression 31]

$$\beta_{mn}^{(l)} = \lambda_n + \sum_{m' \in M(n) \setminus m} \alpha_{m'n}^{(l)} = \beta_n^{(l)} - \alpha_{mn}^{(l)} \quad (35)$$

$$S_m = S'_m \cdot \text{sgn}(\beta_{mn}^{(l)})$$

$$n_i = \arg \min_{n' \in N_k(m) \setminus \{n_1, n_2, \ldots, n_{i-1}, n_i, n\}} [B_{mn'}, |\beta_{mn}^{(l)}|],$$

$$B_{mn_i} = \min_{n' \in N_k(m) \setminus \{n_1, n_2, \ldots, n_{i-1}, n_i, n\}} [B_{mn'}, |\beta_{mn}^{(l)}|], \forall i \in [1, k]$$

Specifically, in the column number n, a result of the addition of the reception LLR: $\lambda_n$ and a total value of the LLR: $\alpha_{m'n}^{(l)}$ other than the m-th row LLR updated in the first-time row processing is expressed as the updated LLR: $\beta_{mn}^{(l)}$. This calculation can also be obtained by subtracting $\alpha_{m'n}^{(l)}$ from $\beta_n^{(l)}$. The above $S_m'$ is multiplied by the sign (+ or −) of $\beta_{mn}^{(l)}$ updated in the first-time column processing, thereby updating $S_m$ to be used in the row processing. The two equations in Equation (35) prescribe the sort process (minimum k value) of $B_{mn(l)}$.

(Row Processing Step 2)

Next, as the row processing again, the repetition first-time LLR: $\alpha'^{(l)}_{mn}$ of the bit n to be sent from the check node m to the bit node n is updated, for the same m executed in the column processing of the column number n, by the following Equation (36):

[Expression 32]

$$\alpha'^{(l)}_{mn} = S_m \cdot \text{sgn}(\beta^{(l)}_{mn}) \cdot \min_{n' \in N_k(m)\setminus n} [B_{mn'}]$$

$$S'_m = S_m \cdot \text{sgn}(\beta^{(l)}_{mn})$$

$$\beta^{(l)}_n = \beta^{(l)}_{mn} + \alpha'^{(l)}_{mn}$$

(36)

Specifically, as the row processing again, $\alpha'^{(l)}_{mn}$ is updated. The updated $\alpha'^{(l)}_{mn}$ is added to $\beta^{(l)}_{mn}$ using the updated result, thereby updating $\beta^{(l)}_n$. Thereafter, by returning to the column processing step, calculation is repeated until when the calculation is completed for all m of the column number n. When the processes at the column processing step and the row processing step end for all rows m having "1" standing in the check matrix of the column number n, the process control moves to the stop regulation.

(Stop Regulation)

Thereafter, when the repetition first-time posterior value $\beta^{(l)}_n$ of the bit n is "$\beta^{(l)}_n > 0$", for example, a decoding result is "$x'_n = 1$" (where x' corresponds to the original transmission signal x). On the other hand, when "$\beta^{(l)}_n \leq 0$" a decoding result is "$x'_n = 0$", and a decoding result $x' = (x_1', x_2', \ldots, X_N')$ is obtained.

When the result of parity check is "Hx'=0" or when the number of repetitions is "$l = 1_{max}$" (when any one of these condition is satisfied), a decoding result x' in this case is output. When none of the two conditions is satisfied, "l=l+1" is set, and the process control returns to the above row processing step 1. Thereafter, the calculation is sequentially performed.

A characteristic operation of the LDPC decoder 5 that executes the above "Serial cyclic approximated min algorithm" is explained in detail with reference to a configuration diagram.

As in the above embodiment, FIG. 6 is a configuration example of the row processing unit 22 that performs row processing according to the "Serial cyclic approximated min algorithm". The row processing unit 22 includes the minimum-value selecting unit 31, the sign calculating unit 32, and the LLR calculating unit 33. In FIG. 6, a Min1LLR (minimum LLR of the m-th row) is $B_{mn(1)}$, a Min2LLR (second minimum LLR of the m-th row) is $B_{mn(2)}$, and these are the values retained in the intermediate-result retaining unit 21. In FIG. 6, $S_m$ and the "sign of the LLR: $\beta_{mn}$ of the m-th row and n-th column of the (l−1)-th time" are also the values retained in the intermediate-result retaining unit 21.

The minimum-value selecting unit 31 selects the Min2LLR($B_{mn(2)}$) when the column number n to be row-processed coincides with the column number n(1) of the Min1LLR($B_{mn(1)}$), and selects the Min1LLR($B_{mn(1)}$) in other cases, and outputs the selected result. The sign calculating unit 32 multiplies the "$S_m$ updated by the (l−1)-th time column processing" by the "sign of the LLR: $\beta_{mn}$ of the m-th row and n-th column of the (l−1)-th time", and outputs $S_m'$ as a result of the multiplication. In this case, $S_m'$ is retained in the intermediate-result retaining unit 21. The LLR calculating unit 33 multiplies the minimum LLR obtained from the minimum-value selecting unit 31 by the multiplication result $S_m'$ of the sign (+ or −) obtained from the sign calculating unit 32, thereby calculating LLR: $\alpha^{(l)}_{mn}$. Based on this, according to the "Min-Sum algorithm", the memory that has been necessary by the row weight portion can be reduced to the k value portion.

Figure 19:
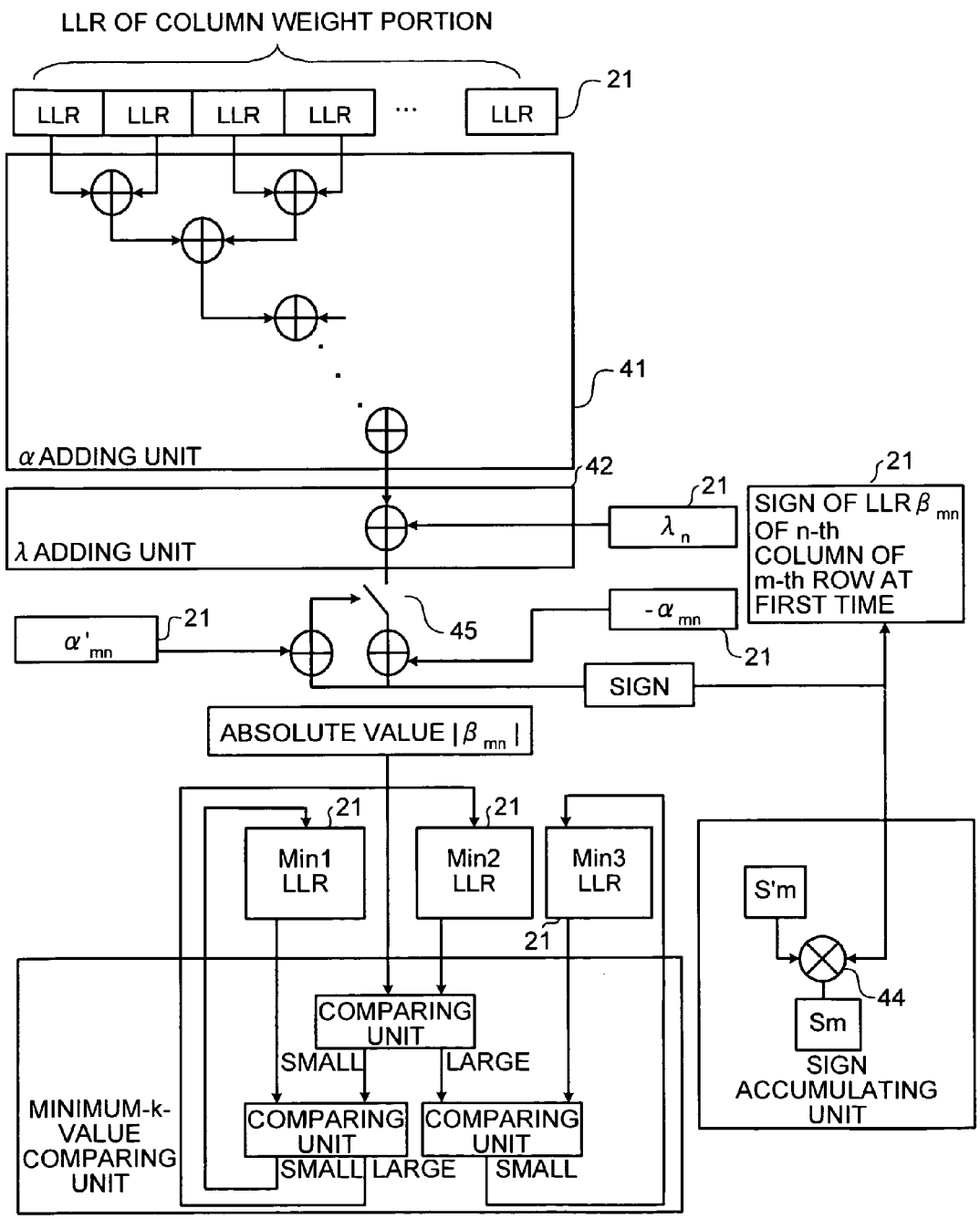
FIG. 19 is a configuration example of a column processing unit that performs column processing in the "Serial cyclic approximated min algorithm" according to a sixth embodiment.

FIG. 19 is a configuration example of the column processing unit 23 that performs column processing according to the "Serial cyclic approximated min algorithm" This column processing unit 23 includes the α adding unit 41, the λ adding unit 42, the minimum-k-value comparing unit 43, and the sign calculating unit 44. In the present embodiment, k=3 is described as an example. In FIG. 19, LLR of a column weight portion, $\alpha'_{mn}$, $\alpha_{mn}$, $\lambda_n$, $S_m'$, Min1LLR, Min2LLR, Min3LLR (third-minimum LLR of the m-th row) are the values retained in the intermediate-result retaining unit 21.

In the column processing unit 23, the α adding unit 41 adds all LLR: $\alpha^{(l)}_{mn}$ including the m-th row LLR updated in the first-time row processing. Further, the λ adding unit 42 adds the reception LLR: $\lambda_n$ to the result of the addition by the α adding unit 41, controls a switch 45 to be first connected to a block below, and outputs $\beta^{(l)}_{mn}$ by subtracting $\alpha^{(l)}_{mn}$ from the added result. The minimum-k-value comparing unit 43 (k=3) receives $|\beta^{(l)}_{mn}|$.

Although not shown in FIG. 19, as in the embodiment described above, when n of the n-th column to be column processed coincides with any one of n(1), n(2), n(3) indicating the column numbers corresponding to $B_{mn(1)}$, $B_{mn(2)}$, $B_{mn(3)}$, stored in the Min1LLR, Min2LLR, Min3LLR respectively, for example, $B_{mn(1)}$ of n=n(i) is thinned, and the operation as shown in FIG. 8 is performed. Specifically, information held in the Min2LLR is deleted, and information held in the Min3LLR is shifted to the Min2LLR. A maximum value "FFFF", for example (in the case of 16 bits), is stored in the Min3LLR. Accordingly, a comparison process excluding the column to be processed can be performed, and at least the Min3LLR can be necessarily updated in the column processing.

After this processing, as shown in FIG. 19, $|\beta^{(l)}_{mn}|$ is compared with each of the Min1LLR, Min2LLR, Min3LLR. When "$|\beta^{(l)}_{mn}| < $Min3LLR", the LLR of the minimum 3 value is updated. On the other hand, the sign of $\beta^{(l)}_{mn}$ output by the λ adding unit 42 is retained in the intermediate-result retaining unit 21, as the "sign of the LLR: $\beta^{(l)}_{mn}$ of the m-th row and n-th column of the first time". Further, the sign calculating unit 44 multiplies $S_m'$ updated in the first-time row processing, by the sign of the above $\beta^{(l)}_{mn}$, and updates $S_m$ retained in the intermediate-result retaining unit 21, using a result of this multiplication. In comparing $|\beta^{(l)}_{mn}|$ with each of the Min1LLR, Min2LLR, Min3LLR, $|\beta^{(l)}_{mn}|$ is first compared with the Min2LLR as the center value of $B_{mn(i)}$, and thereafter, comparison is performed in a tree shape as shown in FIG. 19. For example, there is an effect that the execution time becomes {(k+1)/2}/2 (where k is an odd number), as compared with the effect when $|\beta^{(l)}_{mn}|$ is compared first with the Min1LLR that becomes the minimum value. When k is an even number, there are two center values of $B_{mn(i)}$. In this case, any one of the two values can be compared first. When k is an even number, there is an effect that the execution time becomes {k/2+1}/k (where k is an even number), as compared with the effect when $|\beta^{(l)}_{mn}|$ is compared first with the Min1LLR that becomes the minimum value. From the Min1LLR and Min2LLR of this comparison result, the circuit shown in FIG. 6 obtains $\alpha'^{(l)}_{mn}$, and adds this to $\beta^{(l)}_{mn}$, thereby calculating $\beta^{(l)}_n$, and the process control moves to the next column processing by the switch 45.

The flow of the processing in the "Serial cyclic approximated min algorithm" according to the present embodiment is explained next with reference to a flowchart shown in FIG. 9. In FIG. 9, it is described that the "row processing", "column processing", "row processing", . . . , "column processing" are performed in the "iterative decoding first time", "iterative decoding second time", . . . , "iterative decoding last time". In the present embodiment, after the "row processing step 1", the "column processing step" and the "row processing step 2" are repeated until the calculation is completed for all m of the column number n. That is, the processing is performed in the order of the "row processing step 1", "column processing step", "row processing step 2", "column processing step", "row processing step 2", "column processing step", . . . , "row processing step 2", "row processing step 1", "column processing step", "row processing step 2", "column processing step", "row processing step 2", "column processing step", . . . , "row processing step 2".

In the above "Serial cyclic approximated min algorithm", the reception-LLR calculating unit 11 first calculates the reception LLR from the reception information (steps S11, S12), and sets a result of the calculation to the intermediate-result retaining unit 21, as an initial value (step S13). The controller 25 initializes the number of repetitions as l=1 (step S13). The calculation of Equation (33) is cyclically performed from n=1 to n=N, using the λ adding unit 42, the minimum-k-value comparing unit 43, and the sign calculating unit 44, out of the column processing unit 23 (step S13).

Next, the decoding core unit 12 performs the first-time (first-time to the last-time) iterative decoding calculation (step S14). Specifically, as the first-time iterative decoding, the row processing unit 22 performs the row processing (using the reception LLR) to the row having "1" in the first column, and delivers a result of the calculation to the column processing unit 23. Thereafter, the column processing unit 23 performs the column processing of the first column, and retains (updates) $B_{mn(i)}$ and $S_m$ as a result of the calculation, in the intermediate-result retaining unit 21. Thereafter, the row processing unit 22 executes the row processing step 2, and delivers a result of the calculation to the column processing unit 23. The row processing unit 22 and the column processing unit 23 repeat the column processing step and the row processing step 2. Thereafter, processing similar to the above processing is performed in the order of the second column, third column, . . . , N-th column. $B_{mn(i)}$ and $S_m$ are retained in the intermediate-result retaining unit 21 (corresponding to the iterative decoding first time). At the second and subsequent iterative decoding, the row processing is performed using the LLR and $S_m$ updated by the processing one before. Thereafter, decoding is performed in the similar manner as in the first time.

After executing the first-time iterative decoding, the decoding-result determining unit 24 performs a hard decision on the posterior value calculated at the repetition first time, determines this determination value as the decoding result x', and performs a parity check (stop regulation). In the stop regulation, when a result of the parity check is OK ("Hx'=0") or when the number of repetitions is l=1$_{max}$, the decoding result x' at this time is finally output (step S15). When the above two conditions are not satisfied, the controller 25 sets l=l+1, and the decoding core unit 12 performs the (l+1)-th time iterative decoding.

Deletion of the memory size according to a notation method of a column number is explained next, as in the embodiment described above. FIG. 10 depicts a column number notation according to the present embodiment. In the "Serial cyclic approximated min algorithm", column numbers are noted in the ascending order from n=0, for example. Conventionally, a column number n is expressed as the column number itself (absolute column number) of the parity check matrix. However, in the present embodiment, column numbers are expressed as relative column numbers, such as a minimum column number of "1" of the m-th row in the parity check matrix is expressed as n=0, a column number of the next "1" of the m-th row is expressed as n=1, and thereafter, the column numbers are expressed as n=2, 3, . . . , at each "1". That is, conventionally, when the absolute column number of "1" in the parity check matrix is "32768", the number of bits necessary to express the column number is 15 bits. On the other hand, according to the present embodiment, when the row weight is eight, the memory size can be reduced to three bits which can express 0 to 7. When the row weight is 16, the memory size can be reduced to four bits which can express 0 to 15.

As described above, in the present embodiment, the LDPC decoding is performed to minimize the absolute value $|\beta_{mn}|$ of the LLR for the row processing, to the minimum k value in row unit by the cyclic structure. Therefore, the memory capacity required to store the absolute values can be substantially reduced. When the row weight is 20 and also k=3, for example, the required memory capacity can be reduced to 3/20 of the conventional capacity. Further, by changing the column number from the absolute column number (1, 3, 10, 15 . . . ) to the relative column number (0, 1, 2, 3 . . . ), the required memory capacity can be further reduced.

In the "Serial cyclic approximated min algorithm" according to the present embodiment, calculation and updating of probability information (LLR) by the row processing and column processing are performed cyclically for each one bit. Accordingly, probability propagation can be performed more efficiently than that according to the conventional "Min-Sum algorithm".

In the "Serial cyclic approximated min algorithm" according to the present embodiment, as the row processing step 2, $\alpha'^{(l)}_{mn}$ is updated. The updated $\alpha'^{(l)}_{mn}$ is added to $\beta^{(l)}_{mn}$ using the updated result, thereby updating $\beta_n^{(l)}$. Therefore, the decoding can be related to the serial decoding in the complete bit unit, and the number of repetitions can be further reduced.

In the present embodiment, while the LLR to be row processed has one value, the k number can be any number equal to or higher than two values. In the present embodiment, it is explained that after the row processing step 1 is performed, the column processing step and the row processing step 2 are performed alternately. The updating of the probability information (LLR) by the row processing and the column processing is cyclically performed for each one bit. However, the execution is not limited to the above. Alternatively, calculation and updating of the probability information (LLR) by the row processing and the column processing can be performed cyclically for a plurality of bits each time.

Seventh Embodiment

A receiving device and a decoding method according to a seventh embodiment are explained next. The LDPC decoding according to the present embodiment can be applied when the calculation and updating of the probability information (LLR) by the row processing and column processing are performed for each one bit or a predetermined plurality of bits. For example, the number of repetitions can be reduced by parallelizing calculations. In the present embodiment, the "Serial cyclic approximated min algorithm" is executed using what is called "Overlapped" $B_{mn}^C$ and $S_m$, by arranging such that the $B_{mn(i)}$ and $S_m$ of the intermediate-result retaining unit are one set regardless of the number of parallelization, and parallelized all processing units update the same $B_{mn}^C$ and $S_m$. The decoding algorithm according to the present embodiment is hereinafter called the "Overlapped serial cyclic approximated min algorithm".

The "Overlapped serial cyclic approximated min algorithm" executed by the receiving device according to the present embodiment is shown below.

(Initialization Step)

First, the number of repetitions l=1 and the maximum number of repetitions $l_{max}$ are set. Further, a reception LLR: $\lambda_n$ is input, and $B_{mn(i)}^C$ is obtained as given by the following Equation (37), where $\beta_{mn(i)}^{(0)}$ is an LLR of the minimum k value of the m-th row at the initial time. As a sign of the LLR: $\beta_{mn}^{(0)}$ in the m-th row at the initial time, $\text{sgn}(\lambda_n)$ is input, and $S_m$ is obtained as shown by the following Equation (37):

[Expression 33]

$$B_{mn'}^C = |\beta_{mn(i)}^{(0)}| = \min_{n \in N(m) \setminus \{n(1), n(2), \ldots, n(i-1)\}} [|\lambda_n|], \forall i \in [1, k] \quad (37)$$

$$S_m = \prod_{n \in N(m)} \text{sgn}(\lambda_n)$$

$$n(i) = \arg\min_{n \in N(m) \setminus \{n(1), n(2), \ldots, n(i-1)\}} [|\lambda_n|]$$

$$n(0) = \phi$$

where $B_{mn(i)}^C$ is an absolute value of the LLR: $\beta_{mn(i)}$ of the minimum k value of the m-th row, and is used in common in the parallel processing, n(i) is a column number of the minimum i-th LLR in $B_{mn(i)}^C$.

(Row Processing Step 1)

In the present embodiment, a starting column of each row processing is arbitrary. At the stage where the processing ends up to the final column, decoding is performed again cyclically from the first column. As the row processing, the repetition first-time LLR: $\alpha_{mn}^{(l)}$ of the bit n to be sent from the check node m to the bit node n is updated for $0 \leq g \leq G-1$, $g \cdot N_G + 1 \leq n \leq (g+1) \cdot N_G$, where G is a parallel number, $N_G$ is a column number that each parallelized decoding circuit processes, and $G \cdot N_g = N$, and for each m, by the following Equation (38):

[Expression 34]

$$\alpha_{mn}^{(l)} = \prod_{\substack{n' \in N(m) \setminus n \\ n' < g \cdot N_G}} \text{sgn}(\beta_{mn'}^{(l)}) \cdot \quad (38)$$

$$\prod_{\substack{n' \in N(m) \setminus n \\ n' < g \cdot N_G}} \text{sgn}(\beta_{mn'}^{(l-1)}) \cdot \min_{n' \in N_k(m) \setminus n} \lfloor B_{mn'}^C \rfloor$$

$$= S_m \cdot \text{sgn}(\beta_{mn}^{(l-1)}) \cdot \min_{n' \in N_k(m) \setminus n} [B_{mn'}^C]$$

$$= S_m' \cdot \min_{n' \in N_k(m) \setminus n} [B_{mn'}^C]$$

$$S_m' = S_m \cdot \text{sgn}(\beta_{mn}^{(l-1)})$$

$$\beta_n^{(l)} = \lambda_n + \sum_{m \in M(n)} \alpha_{mn}^{(l)}$$

Specifically, for example, G row processing units allocated to the G columns, into which the column is divided for each column number: $N_G$, perform the row processing in parallel. The G row processing units perform the parallel processing, and perform the same operation as that of the "Serial cyclic approximated min algorithm", except that all the processing units use the same $B_{mn}^C$.

(Column Processing Step)

Next, as the column processing, the repetition first-time LLR: $\beta_{mn}^{(l)}$ of the bit n to be sent from the bit node n to the check node m is updated, for each m of the column number n performed at the row processing step 1, by the following Equation (39). That is, in the present embodiment, the column processing represented by the following Equation (39) is performed in parallel, for each column after the row processing is performed in parallel as described above. However, in performing the column processing in parallel, at the subsequent column processing step and the row processing step 2, the calculation is performed for each row in order starting from the smallest row number of the row number m, for example. However, when all rows having "1" standing are executed without overlapping the order of the row numbers to be executed, the calculation can be performed in any order.

[Expression 35]

$$\beta_{mn}^{(l)} = \lambda_n + \sum_{m' \in M(n) \setminus m} \alpha_{m'n}^{'(l)} = \beta_n^{(l)} - \alpha_{mn}^{(l)} \quad (39)$$

$$S_m = S_m' \cdot \text{sgn}(\beta_{mn}^{(l)})$$

$$n_i = \arg\min_{n' \in N_k(m) \setminus \{n_1, n_2, \ldots, n_{i-1}, n_i, n\}} [B_{mn'}^C, |\beta_{mn}^{(l)}|],$$

$$B_{mn_i} = \min_{n' \in N_k(m) \setminus \{n_1, n_2, \ldots, n_{i-1}, n_i, n\}} [B_{mn'}^C, |\beta_{mn}^{(l)}|], \forall i \in [1, k]$$

(Row Processing Step 2)

Further, as the row processing again, the repetition first-time LLR: $\alpha_{mn}^{'(l)}$ of the bit n to be sent from the check node m to the bit node n is updated, for the same m of the row executed in the column processing of the column number n, by the following Equation (40):

[Expression 36]

$$\alpha_{mn}^{'(l)} = S_m \cdot \text{sgn}(\beta_{mn}^{(l)}) \cdot \min_{n' \in N_k(m) \setminus n} \lfloor B_{mn'}^C \rfloor \quad (40)$$

$$S_m' = S_m \cdot \text{sgn}(\beta_{mn}^{(l)})$$

$$\beta_n^{(l)} = \beta_{mn}^{(l)} + \alpha_{mn}^{'(l)}$$

Specifically, as the row processing again, $\alpha_{mn}^{'(l)}$ is updated. The updated $\alpha_{mn}^{'(l)}$ is added to $\beta_{mn}^{(l)}$ using the updated result, thereby updating $\beta_n^{(l)}$. Thereafter, by returning to the column processing step, calculation is repeated until when the calculation is completed for all m of the column number n. When the processes at the column processing step and the row processing step end for all rows m having "1" standing in the check matrix of the column number n, the process control moves to the stop regulation.

The stop regulation is similar to that of the "Serial cyclic approximated min algorithm" described above.

A configuration and operation of the LDPC decoder 5 according to the seventh embodiment that achieves the above "Overlapped serial cyclic approximated min algorithm" is explained below.

FIG. 13 is a configuration example of the LDPC decoder 5 according to the present embodiment, which is similar to the configuration of the embodiment described above. This LDPC decoder 5 includes the reception-LLR calculating unit 11 that calculates the reception LLR from the reception information, and the decoding core unit 12a that performs decoding of the present embodiment. The decoding core unit 12a includes the intermediate-result retaining unit 21a configured by a memory which stores therein an intermediate result (intermediate value) of decoding, the row processing units 22-1 to 22-G that perform row processing (parallel processing) according to the present embodiment, the column processing units 23-1 to 23-G that execute column processing (parallel processing) according to the present embodiment, the decoding-result determining unit 24 that performs a hard decision of a posterior value in the column processing and an error determination of a parity check result, as a stop regulation according to the present embodiment, and the controller 25a that performs a repetition control of decoding.

In FIG. 13, the LDPC decoder 5 according to the present embodiment uses in common $B_{mn}^C$ and $S_m$ of the intermediate-result retaining unit 21a, following the above Equations (37), (38), (39), and (40), when each row processing unit and each column processing unit perform processing in parallel, thereby updating $B_{mn}^C$ and $S_m$, respectively. Based on this parallel processing, $B_{mn}^C$ and $S_m$ are rapidly updated according to the parallel number, which substantially reduces the number of iterative decodings.

According to the present embodiment, in the parallel processing, when calculation of the same row occurs in the same clock and when the same buffer is referenced, various measures are taken, such as a memory access priority order is set to each processing unit, a memory bank is partitioned, and the timing of the memory access is adjusted using a shift register.

As described above, in the "Overlapped serial cyclic approximated min algorithm" according to the present embodiment, the row processing and the column processing are performed in parallel, using the "Serial cyclic approximated min algorithm" described above. Further, the intermediate-result retaining unit that retains the minimum k value updated in each column processing performed in parallel is shared, and the minimum k value is updated in each column processing performed in parallel. With this arrangement, the decoding number of repetitions can be substantially reduced, as compared with the decrease according to the "Min-Sum algorithm" and the above sixth embodiment.

In the "Overlapped serial cyclic approximated min algorithm" according to the present embodiment, as the row processing step 2, $\alpha'_{mn}{}^{(l)}$ is updated, and the updated $\alpha'_{mn}{}^{(l)}$ is added to $\beta_{mn}{}^{(l)}$ using the updated result, thereby updating $\beta_n{}^{(l)}$. Therefore, the decoding can be related to the serial decoding in the complete bit unit, and the number of repetitions can be further reduced, as compared with the decrease in the second embodiment.

Eighth Embodiment

A receiving device (communication apparatus) and a decoding method according to an eighth embodiment are explained below. In the present embodiment, the process of updating only the absolute value of the LLR of the minimum k value and the decoding using the approximate minimum value in the "Serial cyclic approximated min algorithm" according to the sixth embodiment or the "Overlapped serial cyclic approximated min algorithm" according to the seventh embodiment are cyclically applied to the "Normalized BP-based algorithm" as the known decoding algorithm using the "Min-Sum algorithm".

Before explaining the decoding algorithm of the present embodiment, the known "Normalized BP-based algorithm" that is the basis of the decoding algorithm is shown below. The row processing different from that of the "Min-Sum algorithm" is explained.

(Row Processing Step 1)

A row processing step 1 of the "Normalized BP-based algorithm" can be generalized by the following Equation (41). In this case, as the row processing step 1, the repetition first-time LLR: $\alpha_{mn}{}^{(l)}$ is updated for each of m and n by the following Equation (41), where A is a constant called a normalization factor. In the "Normalized BP-based algorithm", the repetition first-time LLR obtained by the "Min-Sum algorithm" is corrected by the normalization factor A.

[Expression 37]

$$\begin{aligned} \alpha_{mn}^{(l)} &= 2\tanh^{-1}\left(\prod_{n'\in N(m)\backslash n}\tanh\left(\frac{\beta_{mn'}^{(l-1)}}{2}\right)\right) \\ &= 2\tanh^{-1}\left(\prod_{n'\in N(m)\backslash n}\mathrm{sgn}(\beta_{mn'}^{(l-1)})\cdot\prod_{n'\in N(m)\backslash n}\tanh\left(\frac{|\beta_{mn'}^{(l-1)}|}{2}\right)\right) \\ &= \prod_{n'\in N(m)\backslash n}\mathrm{sgn}(\beta_{mn'}^{(l-1)})\cdot 2\tanh^{-1}\left(\prod_{n'\in N(m)\backslash n}\tanh\left(\frac{|\beta_{mn'}^{(l-1)}|}{2}\right)\right) \\ &\approx \frac{1}{A}\prod_{n'\in N(m)\backslash n}\mathrm{sgn}(\beta_{mn'}^{(l-1)})\cdot\min_{n'\in N(m)\backslash n}|\beta_{mn'}^{(l-1)}| \end{aligned} \quad (41)$$

The decoding algorithm when the "Serial cyclic approximated min algorithm" or the "Overlapped serial cyclic approximated min algorithm" is applied to the "Normalized BP-based algorithm" is explained below. In the following, explanations are omitted for the processing (initialization, column processing, and stop regulation) similar to that of the "Serial cyclic approximated min algorithm" or the "Overlapped serial cyclic approximated min algorithm". The row processing step 1 different from that of the "Serial cyclic approximated min algorithm" or the "Overlapped serial cyclic approximated min algorithm" is explained below.

(Row Processing Step 1 Using Serial Cyclic Approximated Min Algorithm)

In the present embodiment, a starting column of the row processing is arbitrary. At the stage where the processing ends to the last column, decoding is performed again cyclically from the first column. The $\alpha_{mn}{}^{(l)}$ and $\alpha'_{mn}{}^{(l)}$ of the row processing steps 1 and 2 of the decoding algorithm according to the present embodiment using the "Serial cyclic approximated min algorithm" can be generalized by the following Equation (42). In this case, as the row processing step 1, the repetition first-time LLR: $\alpha_{mn}{}^{(l)}$ is updated for each of m and n by the following Equation (42). That is, the repetition first-time LLR obtained by the "Serial cyclic approximated min algorithm" is corrected by the normalization factor A in the following Equation (42):

[Expression 38]

$$\begin{aligned} \alpha_{mn}^{(l)} &= \frac{1}{A}\prod_{\substack{n'\in N(m)\backslash n \\ n'<n}}\mathrm{sgn}(\beta_{mn'}^{(l)})\cdot\prod_{\substack{n'\in N(m)\backslash n \\ n'>n}}\mathrm{sgn}(\beta_{mn'}^{(l-1)})\cdot\min_{n'\in N_k(m)\backslash n}[B_{mn'}] \\ &= \frac{1}{A}S_m\cdot\mathrm{sgn}(\beta_{mn}^{(l-1)})\cdot\min_{n'\in N_k(m)\backslash n}[B_{mn'}] \\ &= \frac{1}{A}S'_m\cdot\min_{n'\in N_k(m)\backslash n}[B_{mn'}]. \end{aligned} \quad (42)$$

$$\alpha'^{(l)}_{mn} = \frac{1}{A}S_m\cdot\mathrm{sgn}(\beta_{mn}^{(l)})\cdot\min_{n'\in N_k(m)\backslash n}[B_{mn'}]$$

(Row Processing Step 1 Using Overlapped Serial Cyclic Approximated Min Algorithm)

The $\alpha_{mn}{}^{(l)}$ and $\alpha'_{mn}{}^{(l)}$ of the row processing steps 1 and 2 of the decoding algorithm according to the present embodiment using the "Overlapped serial cyclic approximated min algorithm" can be generalized by the following Equation (43). In this case, as the row processing step 1, the repetition first-time LLR: $\alpha_{mn}^{(l)}$ is updated for $0 \leq g \leq G-1$, $g \cdot N_G + 1 \leq n \leq (g+1) \cdot N_G$, and for each m by the following Equation (43). That is, in the following Equation (43), the repetition first-time LLR obtained by the "Overlapped serial cyclic approximated min algorithm" is corrected by the normalization factor A.

[Expression 39]

$$\alpha_{mn}^{(l)} = \frac{1}{A} \prod_{\substack{n' \in N(m)\backslash n \\ n' < g \cdot N_G}} \text{sgn}(\beta_{mn'}^{(l)}) \cdot \prod_{\substack{n' \in N(m)\backslash n \\ n' > g \cdot N_G}} \text{sgn}(\beta_{mn'}^{(l-1)}) \cdot \min_{n' \in N_k(m)\backslash n} [B_{mn'}^C] \quad (43)$$

$$= \frac{1}{A} S_m \cdot \text{sgn}(\beta_{mn}^{(l-1)}) \cdot \min_{n' \in N_k(m)\backslash n} [B_{mn'}^C]$$

$$= \frac{1}{A} S_m' \cdot \min_{n' \in N_k(m)\backslash n} [B_{mn'}^C]$$

$$\alpha_{mn}'^{(l)} = \frac{1}{A} S_m \cdot \text{sgn}(\beta_{mn}^{(l)}) \cdot \min_{n' \in N_k(m)\backslash n} [B_{mn'}^C]$$

In the decoding algorithm according to the present embodiment, after the row processing step 1 is performed as described above, processing based on the column processing and the stop regulation similar to those of the "Serial cyclic approximated min algorithm" or the "Overlapped serial cyclic approximated min algorithm" is performed to obtain the final code result.

Characteristic operations of the row processing unit of the LDPC decoder 5 that executes the decoding algorithm of the present embodiment are explained below with reference to the drawings. The entire configuration of the LDPC decoder 5 is similar to that shown in FIG. 5 or FIG. 13.

FIG. 15 is a configuration example of the row processing units 22, 22-1 to 22-G that perform row processing of the present embodiment, which is similar to the example of the above embodiments. The row processing unit includes the minimum value selecting unit 31*a*. Configurations similar to those explained with reference to FIG. 6 are denoted by like reference numerals, and explanations thereof are not repeated. The minimum value selecting unit 31*a* according to the present embodiment corrects the minimum value (Min1LLR or Min2LLR) of the LLR read from the intermediate-result retaining unit 21 (or 21*a*), using the normalization factor A, for example. Specifically, the minimum value selecting unit 31*a* performs the normalization by dividing the LLR minimum value by A.

As described above, according to the present embodiment, the "Serial cyclic approximated min algorithm" or the "Overlapped serial cyclic approximated min algorithm" is applied to the "Normalized BP-based algorithm" having the better performance than that of the "Min-Sum algorithm". With this arrangement, effects similar to those of the sixth and seventh embodiments can be obtained. Further, performance close to that of the "Sum-Product algorithm" can be achieved, regardless of the circuit amount substantially equivalent to that of the "Min-Sum algorithm".

In the present embodiment, the "Serial cyclic approximated min algorithm" or the "Overlapped serial cyclic approximated min algorithm" is applied to the "Normalized BP-based algorithm". Alternatively, the "Serial cyclic approximated min algorithm" or the "Overlapped serial cyclic approximated min algorithm" can also be applied to the known "Offset BP-based algorithm" or other algorithm. In this case, effects similar to those described above can also be obtained.

Ninth Embodiment

A receiving device (communication apparatus) and a decoding method according to a ninth embodiment are explained below. In the present embodiment, the process of updating only the absolute value of the LLR of the minimum k value and the decoding using the approximate minimum value in the "Serial cyclic approximated min algorithm" according to the sixth embodiment or the "Overlapped serial cyclic approximated min algorithm" according to the seventh embodiment are cyclically applied to the "δ min algorithm" as the known decoding algorithm having superior correction performance of LLR: $\beta_{mn}$ to that of the "Normalized BP-based algorithm" or the "Offset BP-based algorithm".

Before explaining the decoding algorithm of the present embodiment, the known "δ min algorithm" that is the basis of the decoding algorithm is explained. The row processing different from that of the "Min-Sum algorithm" is explained below.

(Row Processing Step 1)

The $\alpha_{mn}^{(l)}$ and $\alpha'_{mn}^{(l)}$ of the row processing steps 1 and 2 of the "δ min algorithm" can be generalized by the following Equation (44). In this case, as the row processing step 1, the repetition first-time LLR: $\alpha_{mn}^{(l)}$ is updated for each of m and n by the following Equation (44). At the row processing step 1 of the "δ min algorithm", $\alpha_{mn}^{(l)}$ is calculated by calculating $\Theta$ from the absolute value: $|\beta_{mn'}^{(l-1)}|$ of the LLR updated at the repetition l−1-th time.

[Expression 40]

$$\alpha_{m,n}^{(i)} = \prod_{n' \in N(m)\backslash n} \text{sgn}(\beta_{mn'}^{(i-1)}) \cdot \underset{n' \in N(m)\backslash n}{\Theta} [|\beta_{m,n'}^{(i-1)}|] \quad (44)$$

$$\underset{n \in A}{\Theta}(I_n) \equiv I_1 \Theta I_2 \Theta \ldots \Theta I_{|A|}$$

$$a \Theta b \equiv \max(\min(a, b) - \Delta, 0)$$

$$\Delta \equiv \max(0.9 - |a - b|/2, 0)$$

$$\alpha_{m,n}'^{(l)} = \prod_{n' \in N_k(m)\backslash n} \text{sgn}(\beta_{mn'}^{(l)}) \cdot \underset{n' \in N_k(m)\backslash n}{\Theta} [\beta_{mn'}]$$

The decoding algorithm when the "Serial cyclic approximated min algorithm" or the "Overlapped serial cyclic approximated min algorithm" is applied to the "δ min algorithm" is explained below. In the following, explanations are omitted for the processing (initialization, column processing, and stop regulation) similar to that of the "Serial cyclic approximated min algorithm" or the "Overlapped serial cyclic approximated min algorithm". The row processing step 1 different from that of the "Serial cyclic approximated min algorithm" or the "Overlapped serial cyclic approximated min algorithm" is explained below. In the present embodiment, a starting column of the row processing is arbitrary. At the stage where the processing ends to the last column, decoding is performed again cyclically from the first column.

(Row Processing Step 1 Using Serial Cyclic Approximated Min Algorithm)

The $\alpha_{mn}^{(l)}$ and $\alpha'_{mn}^{(l)}$ of the row processing steps 1 and 2 of the decoding algorithm of the present embodiment using the "Serial cyclic approximated min algorithm" can be generalized by the following Equation (45). In this case, as the row processing step 1, the repetition first-time LLR: $\alpha_{mn}^{(l)}$ is updated for $1 \leq n \leq N$ and for each m by the following Equation (45). In the row processing step 1 of the decoding algorithm, $\alpha_{mn}^{(l)}$ is calculated by calculating $\Theta$ from the absolute value: $B_{mn'}$ of the LLR of the minimum k value updated at the repetition l−1-th time.

[Expression 41]

$$\alpha_{mn}^{(l)} = \prod_{\substack{n' \in N(m) \setminus n \\ n' < n}} \text{sgn}(\beta_{mn'}^{(l)}) \cdot \prod_{\substack{n' \in N(m) \setminus n \\ n' > n}} \text{sgn}(\beta_{mn'}^{(l-1)}) \cdot \underset{n' \in N_k(m) \setminus n}{\Theta} [B_{mn'}] \quad (45)$$

$$= S_m \cdot \text{sgn}(\beta_{mn}^{(l-1)}) \cdot \underset{n' \in N_k(m) \setminus n}{\Theta} [B_{mn'}]$$

$$= S'_m \cdot \underset{n' \in N_k(m) \setminus n}{\Theta} [B_{mn'}]$$

$$\alpha'^{(l)}_{m,n} = S_m \cdot \text{sgn}(\beta_{mn}^{(l)}) \cdot \underset{n' \in N_k(m) \setminus n}{\Theta} [\beta_{mn'}]$$

(Row Processing Step 1 Using Overlapped Serial Cyclic Approximated Min Algorithm)

The $\alpha_{mn}^{(l)}$ and $\alpha'^{(l)}_{mn}$ of the row processing steps 1 and 2 of the decoding algorithm of the present embodiment using the "Overlapped serial cyclic approximated min algorithm" can be generalized by the following Equation (46). In this case, as the row processing step 1, the repetition first-time LLR: $\alpha_{mn}^{(l)}$ is updated for $0 \leq g \leq G-1$, $g \cdot N_G + 1 \leq n \leq (g+1) \cdot N_G$, and for each m by the following Equation (46). At the row processing step 1 of this decoding algorithm, $\alpha_{mn}^{(l)}$ is calculated by calculating $\Theta$ from the absolute value: $B_{mn'}^C$ of the LLR of the minimum k value updated by the parallel processing at the repetition l−1-th time.

[Expression 42]

$$\alpha_{mn}^{(l)} = \prod_{\substack{n' \in N(m) \setminus n \\ n' < g \cdot N_G}} \text{sgn}(\beta_{mn'}^{(l)}) \cdot \prod_{\substack{n' \in N(m) \setminus n \\ n' > g \cdot N_G}} \text{sgn}(\beta_{mn'}^{(l-1)}) \cdot \underset{n' \in N_k(m) \setminus n}{\Theta} [B_{mn'}^C] \quad (46)$$

$$= S_m \cdot \text{sgn}(\beta_{mn}^{(l-1)}) \cdot \underset{n' \in N_k(m) \setminus n}{\Theta} [B_{mn'}^C]$$

$$= S'_m \cdot \underset{n' \in N_k(m) \setminus n}{\Theta} [B_{mn'}^C]$$

$$\alpha'^{(l)}_{mn} = S_m \cdot \text{sgn}(\beta_{mn}^{(l)}) \cdot \underset{n' \in N_k(m) \setminus n}{\Theta} [B_{mn'}^C]$$

In the decoding algorithm according to the present embodiment, after the row processing step 1 is performed as described above, processing based on the column processing, the row processing step 2, and the stop regulation similar to those of the "Serial cyclic approximated min algorithm" or the "Overlapped serial cyclic approximated min algorithm" is executed, thereby obtaining the final code result.

Characteristic operations of the row processing unit of the LDPC decoder 5 that executes the decoding algorithm of the present embodiment are explained below with reference to the drawings. The entire configuration of the LDPC decoder 5 is similar to that shown in FIG. 5 or FIG. 13.

FIG. 16 is a configuration example of the row processing units 22, 22-1 to 22-G that perform row processing of the present embodiment, which is similar to that described in the above embodiments. This row processing unit includes the minimum-value selecting unit 31b. Constituent elements similar to those described with reference to FIG. 6 are denoted by like reference numerals, and explanations thereof are not repeated. While the LDPC decoder 5 shown in FIG. 5 is explained as one example, the present embodiment can also be similarly applied to the LDPC decoder 5 shown in FIG. 13.

The minimum-value selecting unit 31b according to the present embodiment reads the Min1LLR($B_{mn(1)}$), Min2LLR ($B_{mn(2)}$), MinkLLR($B_{mn(k)}$), and their column numbers from the intermediate-result retaining unit 21, and the calculating unit performs the $\Theta$ calculation. That is, in the minimum-value selecting unit 31b according to the present embodiment, the calculating unit performs the following calculation in the "δ min algorithm", to $B_{mn(k)}$ in which the n-th column to be processed does not coincide with the column number n(k) of $B_{mn(k)}$ retained in the intermediate-result retaining unit 21.

For example, the calculating unit obtains the updated value $|\alpha_{mn}^{(l)}|$ (=$\Theta[(B_{mn'}])$) excluding the sign as represented by the following Equation (47):

[Expression 43]

$$\underset{n' \in N_k(m) \setminus n}{\Theta} [B_{mn'}] \quad (47)$$

Further, by limiting the LLR to be calculated from the k value to the minimum 3 values, the calculations can be reduced. The calculating unit obtains the updated value $|\alpha_{mn}^{(l)}|$ (=$\Theta[(B_{mn'}])$) excluding the sign as represented by the following Equation (48):

[Expression 44]

$$\text{if } (n = n_{(1)}) \underset{n' \in N_k(m) \setminus n}{\Theta} [B_{mn'}] = B_{mn_{(2)}} \Theta B_{mn_{(3)}} \quad (48)$$

$$\text{else if } (n = n_{(2)}) \underset{n' \in N_k(m) \setminus n}{\Theta} [B_{mn'}] = B_{mn_{(1)}} \Theta B_{mn_{(3)}}$$

$$\text{else } \underset{n' \in N_k(m) \setminus n}{\Theta} [B_{mn'}] = B_{mn_{(1)}} \Theta B_{mn_{(2)}}$$

While the LLR to be calculated is limited from the k value to the minimum 3 values in the above example, the embodiment can also be applied to the case that the LLR is limited to the minimum 4, 5, . . . values.

As described above, according to the present embodiment, the "Serial cyclic approximated min algorithm" or the "Overlapped serial cyclic approximated min algorithm" is applied to the "δ min algorithm" having the better performance than that of the "Min-Sum algorithm". With this arrangement, effects similar to those of the sixth and seventh embodiments can be obtained. Further, performance close to that of the "Sum-Product algorithm" can be achieved, regardless of the circuit amount substantially equivalent to that of the "Min-Sum algorithm". In the present embodiment, description is made for the case that the minimum value of the absolute values of the LLR for the row processing is corrected to the optimum value based on a predetermined correction equation prescribed by the known "δ min algorithm". However, the correction equation is not limited to this, and the correction equation prescribed by the algorithm other than the "δ min algorithm" can also be used. In this case, effects similar to those described above can also be obtained.

Tenth Embodiment

A receiving device (communication apparatus) and a decoding method according to a tenth embodiment are explained below. In the present embodiment, the process of updating only the absolute value of the LLR of the minimum k value and the decoding using the approximate minimum value in the "Serial cyclic approximated min algorithm" according to the sixth embodiment or the "Overlapped serial cyclic approximated min algorithm" according to the seventh embodiment are cyclically applied to the "Sum-Product algorithm".

Before explaining the decoding algorithm of the present embodiment, the known "Sum-Product algorithm" that is the basis of the decoding algorithm is explained. In the present embodiment, a method of calculation by tabling the mathematical function, i.e., a general "Sum-Product algorithm" using a TLU (table lookup), is described. The row processing different from that of the "Sum-Product algorithm" explained in the conventional technology is described.

(Row Processing Step 1 (1))

The $\alpha_{mn}^{(l)}$ and $\alpha'_{mn}^{(l)}$ of the row processing steps 1 and 2 of the "Sum-Product algorithm" using a TLU can be generalized by the following Equation (49). In this case, as the row processing step 1, the repetition first-time LLR: $\alpha_{mn}^{(l)}$ is updated for each of m and n by the following Equation (49). In the row processing step 1 of the "Sum-Product algorithm" using the TLU, a calculation using the TLU is performed to the absolute value: $|\beta_{mn'}^{(l-1)}|$ of the LLR updated at the repetition l−1-th time.

[Expression 45]

$$\alpha_{m,n}^{(i)} = \prod_{n' \in N(m)\backslash n} \mathrm{sgn}(\beta_{mn'}^{(i-1)}) \cdot \underset{n' \in N(m)\backslash n}{TLU}[|\beta_{m,n}^{(i-1)}|] \quad (49)$$

$$\underset{n \in A}{TLU}(I_n) \equiv TLU(I_1, TLU(I_2, \ldots TLU(I_{|A|-1}, I_{|A|})))$$

$$TLU(a, b) \equiv 2\tanh^{-1}\left(\tanh\frac{a}{2}\cdot\tanh\frac{b}{2}\right)$$

$$\alpha_{mn}^{\prime(l)} = \prod_{n' \in N_k(m)\backslash n} \mathrm{sgn}(\beta_{mn'}^{(l)}) \cdot \underset{n' \in N_k(m)\backslash n}{TLU}[\beta_{mn'}^{(l)}]$$

(Row Processing Step 1 (2))

The row processing step 1 of the "Sum-Product algorithm" using the TLU can also be achieved by the method different from the above method. For example, the $\alpha_{mn}^{(l)}$ and $\alpha'_{mn}^{(l)}$ of the row processing steps 1 and 2 of the "Sum-Product algorithm" using a TLU different from the above algorithm can be generalized by the following Equation (50). In this case, as the row processing step 1, the repetition first-time LLR: $\alpha_{mn}^{(l)}$ is updated for each of m and n by the following Equation (50):

[Expression 46]

$$\alpha_{m,n}^{(i)} = \prod_{n' \in N(m)\backslash n} \mathrm{sgn}(\beta_{mn'}^{(i-1)}) \cdot \underset{n' \in N(m)\backslash n}{\Xi}[|\beta_{m,n'}^{(i-1)}|] \quad (50)$$

$$\underset{n \in A}{\Xi}(I_n) \equiv I_1 \Xi I_2 \Theta \ldots \Xi I_{|A|}$$

$$a\Xi b \equiv \min(a, b) + TLU1(|a+b|) - TLU1(|a-b|)$$

$$\alpha_{mn}^{\prime(l)} = \prod_{n' \in N_k(m)\backslash n} \mathrm{sgn}(\beta_{mn'}^{(l)}) \cdot \underset{n' \in N_k(m)\backslash n}{\Xi}[\beta_{mn'}^{(l)}]$$

For the TLU1(x), a table is prepared in advance based on the following (51).

$$TLU1(x) = \ln(1+\exp(-x)) \quad (51)$$

In the "Sum-Product algorithm" using the TLU, the row processing step 1 represented by the above Equation (49) has a characteristic that while the table becomes large, the number of calculations is small. On the other hand, the row processing step 1 represented by the above Equation (50) has a characteristic that the number of calculations is large although the table becomes small.

The decoding algorithm when the "Serial cyclic approximated min algorithm" is applied to the "Sum-Product algorithm" using the TLU is explained below. In the following, explanations are omitted for the processing (initialization, column processing, and stop regulation) similar to that of the "Serial cyclic approximated min algorithm". The row processing step 1 different from that of the "Serial cyclic approximated min algorithm" is explained below. In the present embodiment, a starting column of the row processing is arbitrary, and at the stage where the processing ends up to the final column, decoding is performed again cyclically from the first column.

(Row Processing Step 1 (1) Using Serial Cyclic Approximated Min Algorithm)

The $\alpha_{mn}^{(l)}$ and $\alpha'_{mn}^{(l)}$ of the row processing steps 1 and 2 of the decoding algorithm according to the present embodiment having the "Serial cyclic approximated min algorithm" applied to the row processing step (1) can be generalized by the following Equation (52). In this case, as the row processing step 1, the repetition first-time LLR: $\alpha_{mn}^{(l)}$ is updated for $1 \leq n \leq N$ and for each m by the following Equation (52). In the row processing step 1 of the decoding algorithm, a calculation using the TLU is performed to the absolute value: $B_{mn'}$ of the LLR of the minimum k value updated at the repetition l−1-th time.

[Expression 47]

$$\alpha_{mn}^{(l)} = \prod_{\substack{n' \in N(m)\backslash n \\ n' < n}} \mathrm{sgn}(\beta_{mn'}^{(l)}) \cdot \prod_{\substack{n' \in N(m)\backslash n \\ n' > n}} \mathrm{sgn}(\beta_{mn'}^{(l-1)}) \cdot \underset{n' \in N_k(m)\backslash n}{TLU}[B_{mn'}] \quad (52)$$

$$= S_m \cdot \mathrm{sgn}(\beta_{mn}^{(l-1)}) \cdot \underset{n' \in N_k(m)\backslash n}{TLU}[B_{mn'}]$$

$$= S'_m \cdot \underset{n' \in N_k(m)\backslash n}{TLU}[B_{mn'}]$$

$$\alpha_{mn}^{\prime(l)} = S_m \cdot \mathrm{sgn}(\beta_{mn}^{(l)}) \cdot \underset{n' \in N_k(m)\backslash n}{TLU}[B_{mn'}]$$

(Row Processing Step Using Serial Cyclic Approximated Min Algorithm 1 (2))

The $\alpha_{mn}^{(l)}$ and $\alpha'_{mn}^{(l)}$ of the row processing steps 1 and 2 of the decoding algorithm according to the present embodiment having the "Serial cyclic approximated min algorithm" applied to the row processing step 1(2) can be generalized by the following Equation (53). In this case, as the row processing step 1, the repetition first-time LLR: $\alpha_{mn}^{(l)}$ is updated for $1 \leq n \leq N$ and for each m by the following Equation (53):

[Expression 48]

$$\alpha_{mn}^{(l)} = \prod_{\substack{n' \in N(m)\backslash n \\ n' < n}} \mathrm{sgn}(\beta_{mn'}^{(l)}) \cdot \prod_{\substack{n' \in N(m)\backslash n \\ n' > n}} \mathrm{sgn}(\beta_{mn'}^{(l-1)}) \cdot \underset{n' \in N_k(m)\backslash n}{\Xi}[B_{mn'}] \quad (53)$$

$$= S_m \cdot \mathrm{sgn}(\beta_{mn}^{(l-1)}) \cdot \underset{n' \in N_k(m)\backslash n}{\Xi}[B_{mn'}]$$

$$= S'_m \cdot \underset{n' \in N_k(m)\backslash n}{\Xi}[B_{mn'}]$$

$$\alpha_{mn}^{\prime(l)} = S_m \cdot \mathrm{sgn}(\beta_{mn}^{(l)}) \cdot \underset{n' \in N_k(m)\backslash n}{\Xi}[B_{mn'}]$$

The decoding algorithm when the "Overlapped serial cyclic approximated min algorithm" is applied to the "Sum-Product algorithm" using the TLU is explained below. In the following, explanations are omitted for the processing (initialization, column processing, and stop regulation) similar to that of the "Overlapped serial cyclic approximated min algorithm". The row processing step 1 different from that of the "Overlapped serial cyclic approximated min algorithm" is explained below.

(Row Processing Step Using Overlapped Serial Cyclic Approximated Min Algorithm 1(1))

The $\alpha_{mn}^{(l)}$ and $\alpha'_{mn}^{(l)}$ of the row processing steps 1 and 2 of the decoding algorithm according to the present embodiment having the "Overlapped serial cyclic approximated min algorithm" applied to the row processing step 1(1) can be generalized by the following Equation (54). In this case, as the row processing step 1, the repetition first-time LLR: $\alpha_{mn}^{(l)}$ is updated for $0 \leq g \leq G-1$, $g \cdot N_G + 1 \leq n \leq (g+1) \cdot N_G$, and for each m by the following Equation (54). In the row processing step 1 of this decoding algorithm, a calculation using the TLU is performed to the absolute value: $B_{mn'}^C$ of the LLR of the minimum k value updated by the parallel processing at the repetition l−1-th time.

[Expression 49]

$$\alpha_{mn}^{(l)} = \prod_{\substack{n' \in N(m) \setminus n \\ n' < g \cdot N_G}} \mathrm{sgn}(\beta_{mn'}^{(l)}) \cdot \prod_{\substack{n' \in N(m) \setminus n \\ n' > g \cdot N_G}} (\beta_{mn'}^{(l-1)}) \cdot \underset{n' \in N_k(m) \setminus n}{TLU} \lfloor B_{mn'}^C \rfloor \quad (54)$$

$$= S_m \cdot \mathrm{sgn}(\beta_{mn}^{(l-1)}) \cdot \underset{n' \in N_k(m) \setminus n}{TLU} [B_{mn'}^C]$$

$$= S'_m \cdot \underset{n' \in N_k(m) \setminus n}{TLU} [B_{mn'}^C]$$

$$\alpha'_{mn} = S_m \cdot \mathrm{sgn}(\beta_{mn}^{(l)}) \cdot \underset{n' \in N_k(m) \setminus n}{TLU} [B_{mn'}^C]$$

(Row Processing Step Using Overlapped Serial Cyclic Approximated Min Algorithm 1(2))

The $\alpha_{mn}^{(l)}$ and $\alpha'_{mn}^{(l)}$ of the row processing steps 1 and 2 of the decoding algorithm according to the present embodiment having the "Overlapped serial cyclic approximated min algorithm" applied to the row processing step 1(2) can be generalized by the following Equation (55). In this case, as the row processing step 1, the repetition first-time LLR: $\alpha_{mn}^{(l)}$ is updated for $0 \leq g \leq G-1$, $g \cdot N_G + 1 \leq n \leq (g+1) \cdot N_G$, and for each m by the following Equation (55):

[Expression 50]

$$\alpha_{mn}^{(l)} = \prod_{\substack{n' \in N(m) \setminus n \\ n' < g \cdot N_G}} \mathrm{sgn}(\beta_{mn'}^{(l)}) \cdot \prod_{n' \in N(m) \setminus n} \mathrm{sgn}(\beta_{mn'}^{(l-1)}) \cdot \underset{n' \in N_k(m) \setminus n}{\Xi} [B_{mn'}^C] \quad (55)$$

$$= S_m \cdot \mathrm{sgn}(\beta_{mn}^{(l-1)}) \cdot \underset{n' \in N_k(m) \setminus n}{\Xi} [B_{mn'}^C]$$

$$= S'_m \cdot \underset{n' \in N_k(m) \setminus n}{\Xi} [B_{mn'}^C]$$

$$\alpha'^{(l)}_{mn} = S_m \cdot \mathrm{sgn}(\beta_{mn}^{(l)}) \cdot \underset{n' \in N_k(m) \setminus n}{\Xi} [B_{mn'}^C]$$

Characteristic operations of the row processing unit of the LDPC decoder 5 that executes the decoding algorithm of the present embodiment are explained below with reference to the drawings. The entire configuration of the LDPC decoder 5 is similar to that shown in FIG. 5 or FIG. 13.

FIG. 18 is a configuration example of the row processing units 22, 22-1 to 22-G that perform row processing of the present embodiment, which is similar to the configuration of the embodiment described above. The row processing unit includes the minimum-value selecting unit 31c. Constituent elements similar to those described with reference to FIG. 6 are denoted by like reference numerals, and explanations thereof are not repeated. While the LDPC decoder 5 shown in FIG. 5 is explained as one example, the present embodiment can also be similarly applied to the LDPC decoder 5 shown in FIG. 13.

The minimum-value selecting unit 31c according to the present embodiment reads the Min1LLR($B_{mn(1)}$), Min2LLR ($B_{mn(2)}$), MinkLLR($B_{mn(k)}$), and their column numbers from the intermediate-result retaining unit 21, and the calculating unit performs calculation using the TLU. That is, in the minimum-value selecting unit 31c according to the present embodiment, the calculating unit performs the following calculation in the "Sum-Product min algorithm", to $B_{mn(k)}$ in which the n-th column to be processed does not coincide with the column number n(k) of $B_{mn(k)}$ retained in the intermediate-result retaining unit 21.

For example, the calculating unit obtains the updated value excluding the sign, as represented by the following Equation (56):

[Expression 51]

$$\underset{n' \in N_k(m) \setminus n}{TLU} [B_{mn'}] \text{ OR } \underset{n' \in N_k(m) \setminus n}{\Xi} [B_{mn'}] \quad (56)$$

Further, by limiting the LLR to be calculated from the k value to the minimum 3 values, the calculations can be reduced. The calculating unit obtains the updated value excluding the sign as represented by the following Equation (57):

[Expression 52]

if $(n = n_{(1)}) \underset{n' \in N_k(m) \setminus n}{TLU} [B_{mn'}] =$ (57)

$$TLU(B_{mn_{(2)}}, B_{mn_{(3)}}) \text{ OR } \underset{n' \in N_k(m) \setminus n}{\Xi} [B_{mn'}] = B_{mn_{(2)}} \Xi B_{mn_{(3)}}$$

else if $(n = n_{(2)}) \underset{n' \in N_k(m) \setminus n}{TLU} [B_{mn'}] =$ $$TLU(B_{mn_{(1)}}, B_{mn_{(3)}}) \text{ OR } \underset{n' \in N_k(m) \setminus n}{\Xi} [B_{mn'}] = B_{mn_{(1)}} \Xi B_{mn_{(2)}}$$

else $\underset{n' \in N_k(m) \setminus n}{TLU} [B_{mn'}] =$ $$TLU(B_{mn_{(1)}}, B_{mn_{(2)}}) \text{ OR } \underset{n' \in N_k(m) \setminus n}{\Xi} [B_{mn'}] = B_{mn_{(1)}} \Xi B_{mn_{(2)}}$$

While the LLR to be calculated is limited from the k value to the minimum 3 values in the above example, the embodiment can also be applied to the case that the LLR is limited to the minimum 4, 5, . . . values.

As described above, according to the present embodiment, the "Serial cyclic approximated min algorithm" or the "Overlapped serial cyclic approximated min algorithm" is applied to the "Sum-Product algorithm" using the TLU. With this arrangement, although calculations and the required memory capacity increase as compared with other embodiments, decoding performance can be improved. While the "Sum- Product algorithm" using the TLU is explained in the present embodiment, the principle can be similarly applied to other decoding algorithm for performing the TLU to the mathematical function. In the present embodiment, the TLU prescribed by the known "Sum-Product algorithm" is used for the minimum value of the absolute values of the LLR for the row processing. However, the TLU is not limited to the above, and the TLU other than the TLU prescribed by the "Sum-Product algorithm" can also be used. In this case, effects similar to the effects described above can also be obtained.

In the above embodiments, the processing is performed in the ascending order with the starting column of the row processing set as 1. However, for example, the starting column can be arbitrary, and the processing can be performed to an arbitrary column which is not overlapped. At the stage where the processing ends for all columns, iterative decoding can be performed again in the same order. Alternatively, the starting column of the row processing can be set arbitrary, and the processing can be performed to an arbitrary column which is not overlapped. At the stage where the processing ends for all columns, iterative decoding can be performed again in a different order to the arbitrary column not overlapped until the processing ends for all columns. In these cases, effects similar to those of each of the above embodiments can also be obtained. While the use of the logarithmic likelihood ratio (LLR) as the probability information is explained in the above embodiments, other information than the logarithmic likelihood ratio (LLR) can also be used as the probability information.

INDUSTRIAL APPLICABILITY

As described above, the receiving device and the decoding method according to the present invention are effective for error correction technologies in the digital communication, and are particularly suitable for a communication apparatus that decodes the LDPC encoded signal.

The invention claimed is:

1. A communication apparatus that iteratively decodes a codeword that has been encoded using low-density parity-check coding based on a check matrix, the communication apparatus comprising:
a storage unit that stores therein an intermediate value obtained by a predetermined process of a decoding algorithm;
a first calculating unit that performs row processing to calculate a first logarithmic likelihood ratio (LLR) used in column processing based on an absolute value of a second LLR corresponding to a row weight of the check matrix, the first LLR being sent from a check node to a bit node, and the second LLR being sent from a bit node to a check node; and
a second calculating unit that performs column processing to calculate a second LLR used in row processing based on a first LLR corresponding to a column weight of the check matrix, and stores a minimum value of absolute values of the second LLR in the storage unit, wherein
decoding is performed with the second calculating unit updating the minimum value.

2. The communication apparatus according to claim 1, wherein
a row of the check matrix is divided into a predetermined number of subrows to obtain a divided matrix,
the first calculating unit and the second calculating unit perform the row processing and the column processing, respectively, in parallel on the divided matrix while sharing an area of the storage unit, and
the second calculating unit updates the minimum value each time performing the column processing.

3. The communication apparatus according to claim 1, wherein the first calculating unit uses a minimum value of absolute values of a reception LLR as the minimum value at first decoding.

4. The communication apparatus according to claim 1, wherein the second calculating unit calculates a posterior value each time performing the column processing, makes a hard decision on the posterior value, and outputs a result of the hard decision as a decoding result when a parity check is successful or a predetermined maximum number of iterations has been reached.

5. The communication apparatus according to claim 1, wherein
a starting column for the row processing is arbitrary, and
iterative decoding is performed from the starting column again when processing is completed to the last column.

6. The communication apparatus according to claim 1, wherein
a starting column for the row processing is arbitrary, and processing is performed on arbitrary columns not overlapped in a specific order, and
upon completion of the processing for all columns, iterative decoding is performed on the columns in the specific order.

7. The communication apparatus according to claim 1, wherein
a starting column for the row processing is arbitrary, and processing is performed on arbitrary columns not overlapped in a first order, and
upon completion of the processing for all columns, iterative decoding is performed on the arbitrary columns in a second order until completion of the iterative decoding of all columns.

8. The communication apparatus according to claim 1, wherein a column number of the row weight of the check matrix is indicated in an ascending order from a small column number.

9. The communication apparatus according to claim 1, wherein the first calculating unit corrects a minimum value of absolute values of the second LLR corresponding to the row weight to an optimum value based on a predetermined correction equation, and multiplies the optimum value by a value obtained by multiplying signs of the second LLR to obtain a first LLR to be used in next column processing.

10. The communication apparatus according to claim 9, wherein
the first calculating unit multiplies signs of a second LLR corresponding to a weight of a specific row, and
at first decoding, the first calculating unit multiplies signs of a second LLR updated by column processing of the first decoding for a column number smaller than a column number to be processed to obtain a first multiplied value, and multiplies signs of a second LLR updated by column processing of (l−1)-th decoding for a column number larger than the column number to be processed to obtain a second multiplied value, and multiplies the first multiplied value and the second multiplied value.

11. The communication apparatus according to claim 9, wherein
the first calculating unit multiplies signs of a second LLR corresponding to a weight of a specific row, and
at first decoding, the first calculating unit multiplies a value obtained by multiplying signs of a second LLR corresponding to a row weight updated by column processing of (l−1)-th decoding by signs of a second LLR updated by column processing of the (l−1)-th decoding corresponding to a column number to be processed to obtain a multiplied value, and stores the multiplied value in the storage unit.

12. The communication apparatus according to claim 11, wherein, at first decoding,
the second calculating unit obtains the second LLR by adding a reception LLR corresponding to the column number to be processed to a sum of values of a first LLR corresponding to a column weight of a row number other than a number of a row to be processed,
the second calculating unit updates the minimum value when an absolute value of the second LLR is smaller than at least one of minimum values of the row to be processed, and
the second calculating unit multiplies a sign of the second LLR by the multiplied value stored in the storage unit to update the multiplied value as a value obtained by multiplying signs of a second LLR used in the (l−1)-th decoding.

13. The communication apparatus according to claim 1, wherein the first calculating unit performs a predetermined calculation using table lookup on a minimum value of absolute values of the second LLR corresponding to the row weight to obtain a calculated value, and multiplies the calculated value by a value obtained by multiplying signs of the second LLR to obtain a first LLR to be used in next column processing.

14. The communication apparatus according to claim 13, wherein
the first calculating unit multiplies signs of a second LLR corresponding to a weight of a specific row, and
at first decoding, the first calculating unit multiplies signs of a second LLR updated by column processing of the first decoding for a column number smaller than a column number to be processed to obtain a first multiplied value, and multiplies signs of a second LLR updated by column processing of (l−1)-th decoding for a column number larger than the column number to be processed to obtain a second multiplied value, and multiplies the first multiplied value and the second multiplied value.

15. The communication apparatus according to claim 13, wherein
the first calculating unit multiplies signs of a second LLR corresponding to a weight of a specific row, and
at first decoding, the first calculating unit multiplies a value obtained by multiplying signs of a second LLR corresponding to a row weight updated by column processing of (l−1)-th decoding by signs of a second LLR updated by column processing of the (l−1)-th decoding corresponding to a column number to be processed to obtain a multiplied value, and stores the multiplied value in the storage unit.

16. The communication apparatus according to claim 15, wherein, at first decoding,
the second calculating unit obtains the second LLR by adding a reception LLR corresponding to the column number to be processed to a sum of values of a first LLR corresponding to a column weight of a row number other than a number of a row to be processed,
the second calculating unit updates the minimum value when an absolute value of the second LLR is smaller than at least one of minimum values of the row to be processed, and
the second calculating unit multiplies a sign of the second LLR by the multiplied value stored in the storage unit to update the multiplied value as a value obtained by multiplying signs of a second LLR used in the (l−1)-th decoding.

17. The communication apparatus according to claim 1, wherein the first calculating unit multiplies a minimum value of absolute values of the second LLR corresponding to the row weight by a value obtained by multiplying signs of the second LLR to obtain a first LLR to be used in next column processing.

18. The communication apparatus according to claim 17, wherein the first calculating unit corrects the minimum value by a predetermined normalization factor to obtain a corrected value, and obtains the first LLR based on the corrected value.

19. The communication apparatus according to claim 17, wherein
the first calculating unit multiplies signs of a second LLR corresponding to a weight of a specific row, and
at first decoding, the first calculating unit multiplies signs of a second LLR updated by column processing of the first decoding for a column number smaller than a column number to be processed to obtain a first multiplied value, and multiplies signs of a second LLR updated by column processing of (l−1)-th decoding for a column number larger than the column number to be processed to obtain a second multiplied value, and multiplies the first multiplied value and the second multiplied value.

20. The communication apparatus according to claim 17, wherein
the first calculating unit multiplies signs of a second LLR corresponding to a weight of a specific row, and
at first decoding, the first calculating unit multiplies a value obtained by multiplying signs of a second LLR corresponding to a row weight updated by column processing of (l−1)-th decoding by signs of a second LLR updated by column processing of the (l−1)-th decoding corresponding to a column number to be processed to obtain a multiplied value, and stores the multiplied value in the storage unit.

21. The communication apparatus according to claim 20, wherein, at first decoding,
the second calculating unit obtains the second LLR by adding a reception LLR corresponding to the column number to be processed to a sum of values of a first LLR corresponding to a column weight of a row number other than a number of a row to be processed,
the second calculating unit updates the minimum value when an absolute value of the second LLR is smaller than at least one of minimum values of the row to be processed, and
the second calculating unit multiplies a sign of the second LLR by the multiplied value stored in the storage unit to update the multiplied value as a value obtained by multiplying signs of a second LLR used in the (l−1)-th decoding.

22. A communication apparatus that iteratively decodes a codeword that has been encoded using low-density parity-check coding based on a check matrix, the communication apparatus comprising:
a first calculating unit that performs row processing to calculate a first logarithmic likelihood ratio (LLR) used in column processing based on an absolute value of a second LLR corresponding to a row weight of the check matrix, the first LLR being sent from a check node to a bit node, and the second LLR being sent from a bit node to a check node; and a second calculating unit that performs column processing to calculate a second LLR used in row processing based on a first LLR corresponding to a column weight of the check matrix, wherein the first calculating unit and the second calculating unit alternately perform the row processing and the column processing a predetermined number of times, and cyclically update the first LLR and the second LLR.

23. The communication apparatus according to claim 22, wherein the first calculating unit corrects a minimum value of absolute values of the second LLR corresponding to the row weight to an optimum value based on a predetermined correction equation, and multiplies the optimum value by a value obtained by multiplying signs of the second LLR to obtain a first LLR to be used in next column processing.

24. The communication apparatus according to claim 22, wherein the first calculating unit performs a predetermined calculation using table lookup on a minimum value of absolute values of the second LLR corresponding to the row weight to obtain a calculated value, and multiplies the calculated value by a value obtained by multiplying signs of the second LLR to obtain a first LLR to be used in next column processing.

25. The communication apparatus according to claim 22, wherein
the first calculating unit multiplies signs of a second LLR corresponding to a weight of a specific row, and
at first decoding, the first calculating unit multiplies signs of a second LLR updated by column processing of the first decoding for a column number smaller than a column number to be processed to obtain a first multiplied value, and multiplies signs of a second LLR updated by column processing of (l−1)-th decoding for a column number larger than the column number to be processed to obtain a second multiplied value, and multiplies the first multiplied value and the second multiplied value.

26. The communication apparatus according to claim 22, wherein the first calculating unit uses a minimum value of absolute values of a reception LLR as the minimum value at first decoding.

27. The communication apparatus according to claim 22, wherein the second calculating unit calculates a posterior value each time performing the column processing, makes a hard decision on the posterior value, and outputs a result of the hard decision as a decoding result when a parity check is successful or a predetermined maximum number of iterations has been reached.

28. The communication apparatus according to claim 22, wherein
a starting column for the row processing is arbitrary, and iterative decoding is performed from the starting column again when processing is completed to the last column.

29. The communication apparatus according to claim 22, wherein
a starting column for the row processing is arbitrary, and processing is performed on arbitrary columns not overlapped in a specific order, and
upon completion of the processing for all columns, iterative decoding is performed on the columns in the specific order.

30. The communication apparatus according to claim 22, wherein
a starting column for the row processing is arbitrary, and processing is performed on arbitrary columns not overlapped in a first order, and
upon completion of the processing for all columns, iterative decoding is performed on the arbitrary columns in a second order until completion of the iterative decoding of all columns.

31. The communication apparatus according to claim 22, wherein a column number of the row weight of the check matrix is indicated in an ascending order from a small column number.

32. The communication apparatus according to claim 22, wherein the first calculating unit and the second calculating unit update the first LLR and the second LLR each time performing the row processing and the column processing.

33. The communication apparatus according to claim 22, wherein the first calculating unit multiplies a minimum value of absolute values of the second LLR corresponding to the row weight by a value obtained by multiplying signs of the second LLR to obtain a first LLR to be used in next column processing.

34. The communication apparatus according to claim 33, wherein the first calculating unit corrects the minimum value by a predetermined normalization factor to obtain a corrected value, and obtains the first LLR based on the corrected value.

35. A decoding method for iteratively decoding a codeword that has been encoded using low-density parity-check coding based on a check matrix, the decoding method comprising:
first calculating by row processing a first logarithmic likelihood ratio (LLR) used in column processing based on an absolute value of a second LLR corresponding to a row weight of the check matrix, the first LLR being sent from a check node to a bit node, and the second LLR being sent from a bit node to a check node;
second calculating by column processing a second LLR used in row processing based on a first LLR corresponding to a column weight of the check matrix obtained by the row processing;
storing a minimum value of absolute values of the second LLR in a predetermined area of a memory; and
performing decoding while updating the minimum value.

36. A decoding method for iteratively decoding a codeword that has been encoded using low-density parity-check coding based on a check matrix, the decoding method comprising:
first calculating by row processing a first logarithmic likelihood ratio (LLR) used in column processing based on an absolute value of a second LLR corresponding to a row weight of the check matrix, the first LLR being sent from a check node to a bit node, and the second LLR being sent from a bit node to a check node;
second calculating by column processing a second LLR used in row processing based on a first LLR corresponding to a column weight of the check matrix obtained by the row processing;
alternately perform the row processing and the column processing a predetermined number of times to cyclically update the first LLR and the second LLR.

* * * * *